United States Patent
Guo et al.

(10) Patent No.: US 10,593,678 B1
(45) Date of Patent: Mar. 17, 2020

(54) METHODS OF FORMING SEMICONDUCTOR DEVICES USING ASPECT RATIO DEPENDENT ETCHING EFFECTS, AND RELATED SEMICONDUCTOR DEVICES

(71) Applicant: Micron Technology, Inc., Boise, ID (US)

(72) Inventors: Song Guo, Boise, ID (US); Sanh D. Tang, Kuna, ID (US); Vlad Temchenko, Boise, ID (US); Shivani Srivastava, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/111,499

(22) Filed: Aug. 24, 2018

(51) Int. Cl.
  *H01L 27/108* (2006.01)
  *H01L 21/308* (2006.01)
  *G11C 11/408* (2006.01)

(52) U.S. Cl.
  CPC .... *H01L 27/10873* (2013.01); *H01L 21/3086* (2013.01); *H01L 27/10814* (2013.01); *H01L 27/10855* (2013.01); *H01L 27/10885* (2013.01); *H01L 27/10888* (2013.01); *H01L 27/10891* (2013.01); *G11C 11/4087* (2013.01)

(58) Field of Classification Search
  CPC ........... H01L 27/10873; H01L 21/3086; H01L 27/10814; H01L 27/10855; H01L 27/10888; H01L 27/10891; G11C 11/4087
  USPC ........................................................ 365/51
  See application file for complete search history.

(56) References Cited

U.S. PATENT DOCUMENTS 6,716,758 B1   4/2004   Donohoe et al.
9,564,442 B2 *  2/2017   Tang .................. H01L 27/1085
9,881,924 B2   1/2018   Wang et al.
(Continued)

FOREIGN PATENT DOCUMENTS

KR   10-2013-0053018 A   5/2013

OTHER PUBLICATIONS

International Search Report from International Application No. PCT/US2019/044286, dated Nov. 22, 2019, 3 pages.
(Continued)

*Primary Examiner* — Harry W Byrne
(74) *Attorney, Agent, or Firm* — TraskBritt

(57) ABSTRACT

A method of forming a semiconductor device comprises forming a patterned masking material comprising parallel structures and parallel trenches extending at a first angle from about 30° to about 75° relative to a lateral direction. A mask is provided over the patterned masking material and comprises additional parallel structures and parallel apertures extending at a second, different angle from about 0° to about 90° relative to the lateral direction. The patterned masking material is further patterned using the mask to form a patterned masking structure comprising elongate structures separated by the parallel trenches and additional parallel trenches. Exposed portions of a hard mask material underlying the patterned masking structure are subjected to ARDE to form a patterned hard mask material. Exposed portions of a semiconductive material underlying the patterned hard mask material are removed to form semiconductive pillar structures. Semiconductor devices and electronic systems are also described.

9 Claims, 15 Drawing Sheets

(56) References Cited

U.S. PATENT DOCUMENTS

| | | |
|---|---|---|
| 2007/0082458 A1 | 4/2007 | Matsumoto |
| 2008/0296666 A1 | 12/2008 | Iijima |
| 2014/0117566 A1 | 5/2014 | Choi et al. |
| 2014/0239512 A1 | 8/2014 | Pellizzer et al. |
| 2015/0221548 A1 | 8/2015 | Yu et al. |
| 2016/0300842 A1* | 10/2016 | Tang .................. H01L 27/1085 |
| 2018/0025783 A1 | 1/2018 | Choi |
| 2018/0226406 A1* | 8/2018 | Surthi ................. H01L 27/1052 |

OTHER PUBLICATIONS

International Written Opinion from International Application No. PCT/US2019/044286, dated Nov. 22, 2019, 8 pages.

\* cited by examiner

METHODS OF FORMING SEMICONDUCTOR DEVICES USING ASPECT RATIO DEPENDENT ETCHING EFFECTS, AND RELATED SEMICONDUCTOR DEVICES

TECHNICAL FIELD

Embodiments of the disclosure relate to the field of semiconductor device design and fabrication. More specifically, embodiments of the disclosure relate to methods of forming semiconductor devices using aspect ratio dependent etching effects, and to related semiconductor devices, memory devices, and electronic systems.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of memory device features places ever increasing demands on the methods used to form the memory device features. For example, one of the limiting factors in the continued shrinking of memory devices is the resistance of the contacts associated therewith. As used herein, a "contact" refers to a connection facilitating a conductive pathway between at least two structures. For example, in a DRAM device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be stored. As the dimensions of memory device (e.g., DRAM device) features decrease, the dimensions of the contacts associated therewith also decrease, resulting in increased contact resistance. Increased contact resistance decreases the drive current of the memory device, which can adversely affect memory device performance.

One approach toward decreasing contact resistance within a memory device has been to increase the surface area of the contacts thereof. For example, material may be removed from multiple surfaces of a memory device feature to form a three-dimensional (3D) contact exhibiting greater contact surface area than the memory device feature would otherwise exhibit. However, conventional methods of forming 3D contacts for a DRAM device structure exhibiting lower critical dimensions, such as critical dimensions less than about 20 nanometers (nm), can require complex and costly processes to sufficiently form and align 3D storage node contacts relative to digit line (e.g., bit line) contacts to ensure proper performance of the DRAM device.

For example, one conventional method of forming 3D contacts exhibiting lower critical dimensions includes transferring a pattern of openings and features in a mask structure into a hard mask material overlying a semiconductive material, and then using the patterned hard mask material to selectively etch (e.g., selectively dry etch) the underlying semiconductive material and form semiconductive pillars each including two storage node (e.g., memory element) contact regions and a digit line contact region laterally between the two storage node contact regions. However, transferring the pattern of the mask structure into the hard mask material typically requires aspect ratio dependent etching (ARDE) of the hard mask material, which can effectuate undesirable structural characteristics in the subsequently formed semiconductive pillars. During ARDE, the rate of material (e.g., hard mask material) removal depends on the aspect ratio of the opening (e.g., trench) being formed, which is defined as the ratio of the depth of the opening to the width (e.g., diameter). Openings with relatively higher aspect ratios are etched more slowly than openings with relatively smaller aspect ratios. In other words, the etch rate, in terms of linear depth etched per unit time, is smaller for high aspect ratio openings than for low aspect ratio openings. As a result, some features (e.g., pillar structures) of the patterned hard mask material can exhibit variable lateral dimensions across the heights thereof depending on variations in the widths of the openings in the mask structure. In turn, such variable lateral dimensions can effectuate undesirable lateral dimensions and shapes in the semiconductive pillars formed using the patterned hard mask material that can leave very little process margin to circumvent digit line to storage element (e.g., memory element) shorts in a DRAM device including the semiconductive pillars.

A need, therefore, exists for new, simple, and cost-efficient methods of forming semiconductive device structures for a semiconductor device (e.g., a DRAM device), such as, for example, DRAM device structures having critical dimensions less than about 20 nm.

DETAILED DESCRIPTION

Figure 1A:
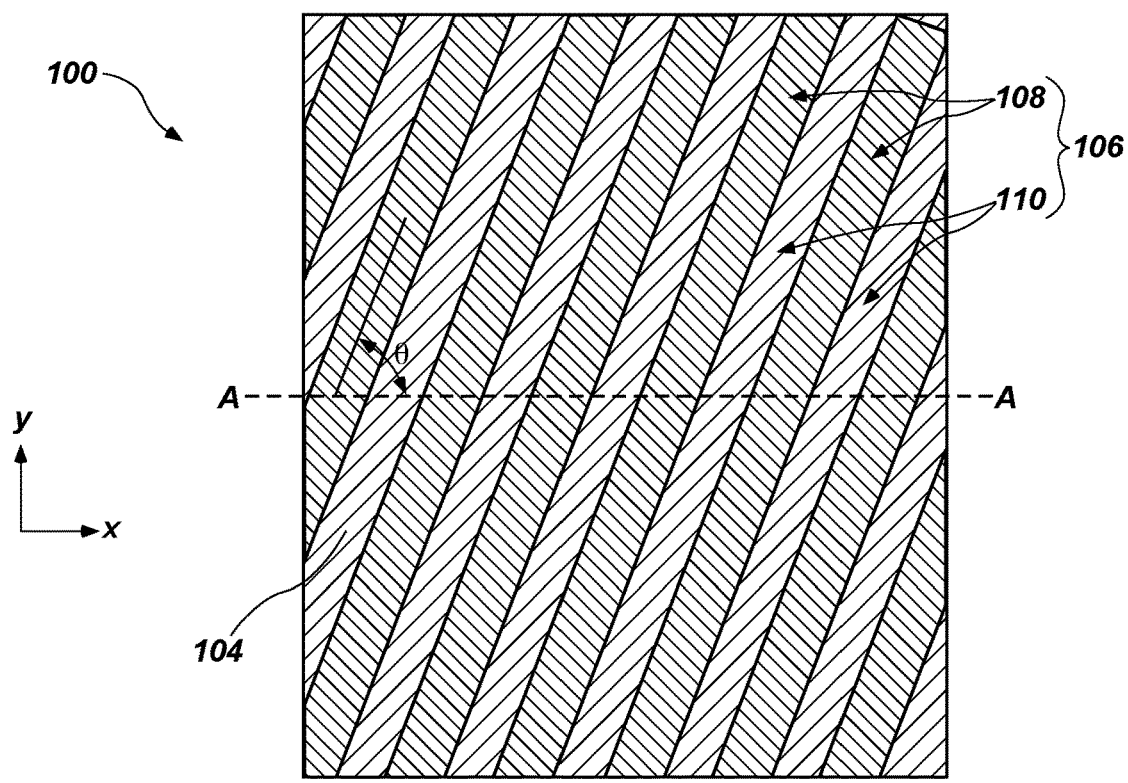
FIGS. 1A through 7B are simplified partial top-down (FIGS. 1A, 2A, 3A, 4A, 5A, 6A, and 7A) and simplified partial cross-sectional (FIGS. 1B, 2B, 3B, 4B, 5B, 6B, and 7B) views illustrating a method of forming a semiconductor device structure, in accordance with embodiments of the disclosure.

Methods of forming semiconductor devices using ARDE effects are described herein, as are related semiconductor devices, memory devices, and electronic systems. In some embodiments, a method of forming a semiconductor device comprises forming a patterned masking material over a hard mask material overlying a semiconductive material. The patterned masking material may comprise parallel line structures and parallel linear trenches each laterally extending at a first angle within a range of from about 30 degrees to about 75 degrees relative to a first lateral direction (e.g., an X-direction). A mask (e.g., an etch mask, a subtractive removal mask, a chop mask) may be provided over the patterned masking material. The mask may comprise additional parallel line structures and parallel linear apertures each laterally extending at a second angle different than the first angle and within a range of from about 0 degrees to about 90 degrees relative to the first lateral direction. Portions of the patterned masking material not covered by the additional parallel line structures of the mask may be selectively removed to form a patterned masking structure comprising elongate pillar structures separated from one another by the parallel linear trenches laterally extending at the first angle and additional parallel linear trenches laterally extending at the second angle. Overlapping regions of the parallel linear trenches and additional parallel linear trenches of the patterned masking structure are located laterally adjacent tips (e.g., corners) of the elongate pillar structures. Portions of the hard mask material not covered by the elongate pillar structures are subjected to ARDE to form a patterned hard mask material comprising elongate hard mask structures exhibiting portions vertically underlying and within lateral boundaries of the overlapping regions of the parallel linear trenches and the additional parallel linear trenches of the patterned masking structure. Portions of the semiconductive material not covered by the elongate hard mask structures are selectively removed to form a patterned semiconductive material comprising elongate semiconductive pillar structures. The methods of the disclosure may facilitate increased reliability and performance in semiconductor device structures (e.g., DRAM device structures, such as DRAM cells), semiconductor devices (e.g., DRAM devices), and electronic systems that rely on high feature density.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIGS. 1A through 7B are simplified partial top-down (FIGS. 1A, 2A, 3A, 4A, 5A, 6A, and 7A) and simplified partial cross-sectional (FIGS. 1B, 2B, 3B, 4B, 5B, 6B, and 7B) views illustrating embodiments of a method of forming a semiconductor device structure (e.g., a memory device structure, such as a DRAM device structure) for a semiconductor device (e.g., a memory device, such as a DRAM device). With the description provided below, it will be readily apparent to one of ordinary skill in the art that the methods described herein may be used in various devices. In other words, the methods of the disclosure may be used whenever it is desired to form a semiconductor device.

Figure 1B:
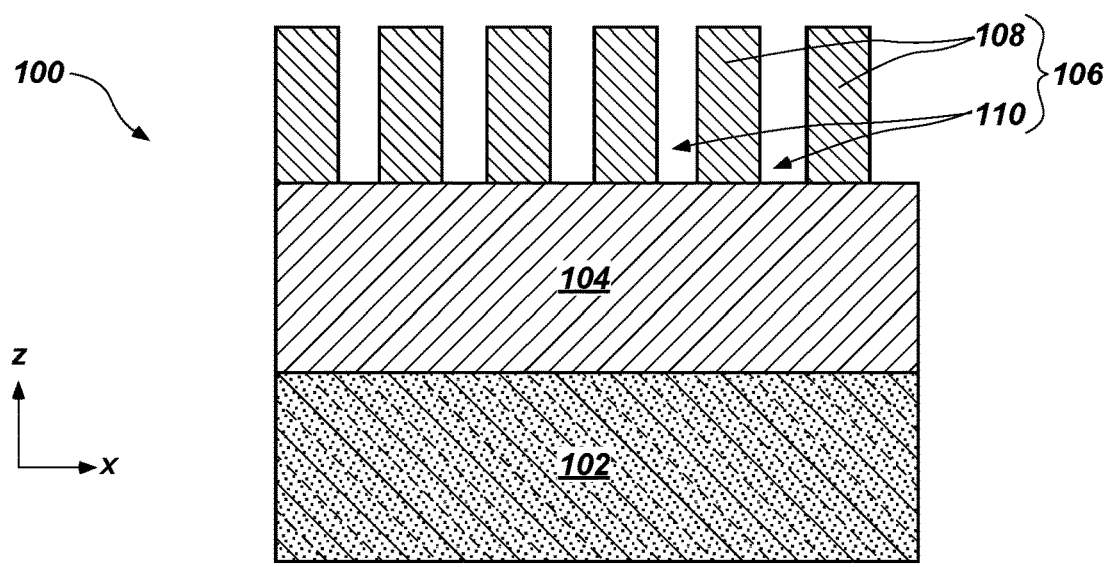

Referring to collectively to FIGS. 1A and 1B, a semiconductor device structure 100 may include a semiconductive material 102 (FIG. 1B), a hard mask material 104 on or over the semiconductive material 102, and a patterned masking material 106 on or over the hard mask material 104. The semiconductive material 102 may, for example, comprise one or more a silicon material, a silicon-germanium material, a germanium material, a gallium arsenide material, a gallium nitride material, and an indium phosphide material. In some embodiments, the semiconductive material 102 comprises at least one silicon material. As used herein, the term "silicon material" means and includes a material that includes elemental silicon or a compound of silicon. The semiconductive material 102 may, for example, comprise one or more of monocrystalline silicon and polycrystalline silicon.

The hard mask material 104 may comprise at least one material suitable for use as an etch mask to pattern portions of the semiconductive material 102 (FIG. 1B) following the patterning of the hard mask material 104, as described in further detail below. By way of non-limiting example, the hard mask material 104 may be formed of and include at least one of amorphous carbon, silicon, a silicon oxide, a silicon nitride, a silicon oxycarbide, aluminum oxide, and a silicon oxynitride. In some embodiments, the hard mask material 104 comprises at least one oxide dielectric material (e.g., one or more of silicon dioxide and aluminum oxide). The hard mask material 104 may be homogeneous (e.g., may comprise a single material), or may be heterogeneous (e.g., may comprise a stack including at least two different materials).

The semiconductive material 102 and the hard mask material 104 may each individually be formed using conventional processes including, but not limited to, one or more of physical vapor deposition ("PVD"), chemical vapor deposition ("CVD"), atomic layer deposition ("ALD"), in situ growth, spin-on coating, and blanket coating. CVD includes, but is not limited to plasma enhanced CVD ("PECVD") and low pressure CVD ("LPCVD"). PVD includes, but is not limited to, sputtering, evaporation, and ionized PVD. Such processes are known in the art and, therefore, are not described in detail herein.

The patterned masking material 106 may include parallel line structures 108 separated from one another by parallel linear trenches 110. As used herein, the term "parallel" means substantially parallel. Each of the parallel line structures 108 may, for example, be formed of and include a material having etch selectivity relative to the hard mask material 104. At least some portions of the parallel line structures 108 may be selectively removed relative to the hard mask material 104 through one or more material removal processes, and/or at least some portions of the hard mask material 104 may be selectively removed relative to the parallel line structures 108 through one or more other material removal processes. In some embodiments, the parallel line structures 108 comprise a nitride dielectric material (e.g., silicon nitride). In additional embodiments, the parallel line structures 108 comprise photoresist material.

Each of the parallel line structures 108 of the patterned masking material 106 may at least have substantially the same width (e.g., minor lateral dimension), and may be regularly spaced by substantially the same distance (corresponding to a width of each of the parallel linear trenches 110). Accordingly, a pitch between centerlines of adjacent parallel line structures 108 may be substantially uniform throughout the patterned masking material 106. The dimensions and spacing of the parallel line structures 108 (and, hence, of the parallel linear trenches 110) of the patterned masking material 106 may be selected to provide desired lateral dimensions and lateral spacing to features to be subsequently formed from the hard mask material 104 when accounting for ARDE effects, as described in further detail below. In some embodiments, the width of each of the parallel line structures 108 is less than or equal to about 20 nm, and the distance between laterally-neighboring parallel line structures 108 is greater than or equal to the width of the parallel line structures 108.

As shown in FIG. 1A, each of the parallel line structures 108 of the patterned masking material 106 may be formed at a first angle θ offset from a first lateral direction (e.g., the X-direction) in which one or more subsequently formed structures (e.g., access lines, such as word lines) may laterally extend. The first angle θ of the parallel line structures 108 (and, hence, of the parallel linear trenches 110) may, for example, be greater than zero (0) degrees and less than or equal to about ninety (90) degrees relative to the first lateral direction, such as within a range of from about ten (20) degrees to about eighty (80) degrees, from about thirty (30) degrees to about seventy-five (75) degrees, or from about forty (40) degrees to about seventy (70) degrees. The first angle θ of the parallel line structures 108 may be selected at least partially based on a desired architecture of the semiconductor device structure 100, and on desired dimensions of features to be formed from the hard mask material 104 using portions of the patterned masking material 106, as described in further detail below. The first angle θ of the parallel line structures 108 and the parallel linear trenches 110 partially influences the dimensions and shapes of features formed from the hard mask material 104 through ARDE, which, in turn, influence the dimensions and shapes of features formed from the semiconductive material 102. In some embodiments, the first angle θ of the parallel line structures 108 is about sixty-nine (69) degrees. In FIG. 1A the line A-A extends in the X-direction, and corresponds to the cross-section of the semiconductor device structure 100 depicted in FIG. 1B.

The patterned masking material 106 may be formed using conventional processes (e.g., conventional deposition processes, such as one or more of in situ growth, spin-on coating, blanket coating, CVD, ALD, and PVD; conventional patterning and material removal processes, such as conventional photolithographic exposure processes, conventional development processes, conventional etching processes) and conventional processing equipment, which are not described in detail herein.

Figure 2A:
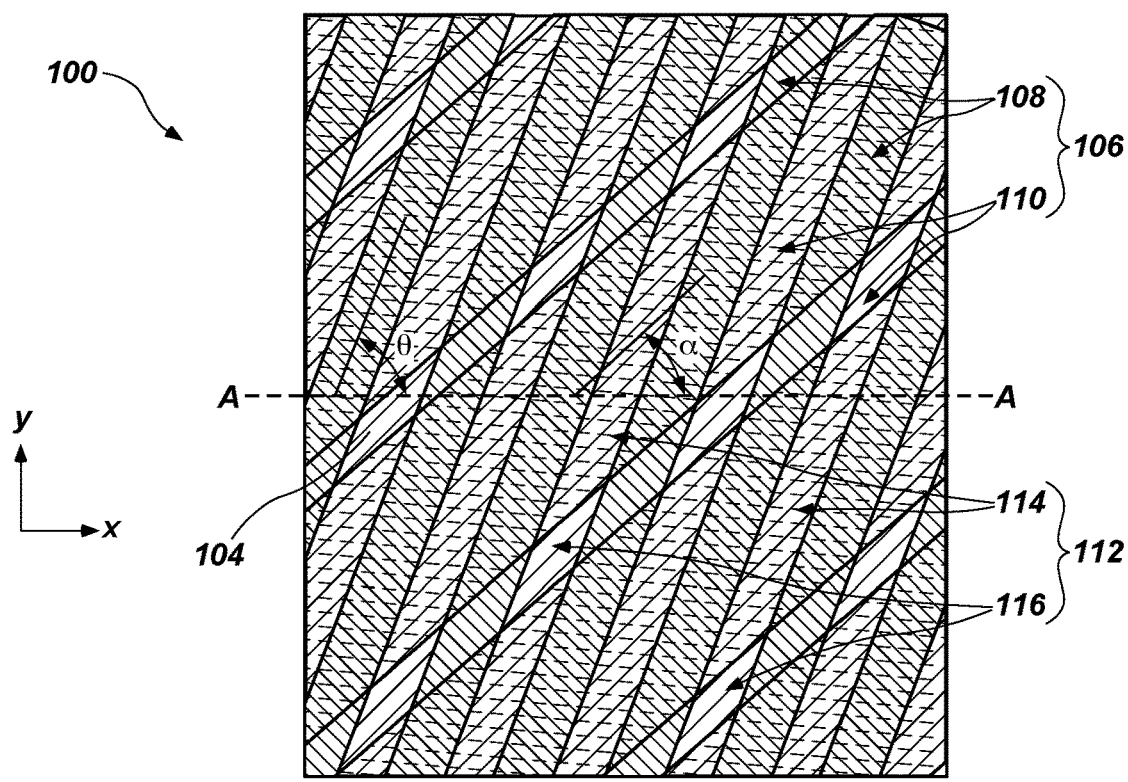
Figure 2B:
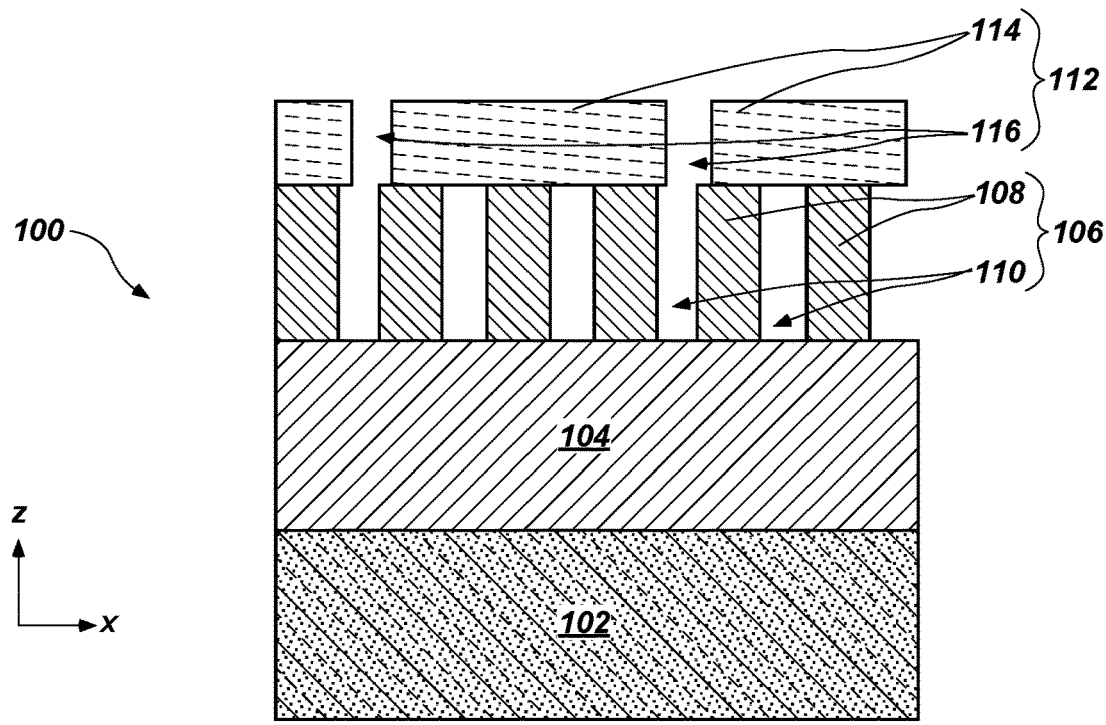

Referring next to FIG. 2A, a mask 112 (e.g., an etch mask, a chop mask) may be provided on or over the patterned masking material 106. The mask 112 may be formed of and include at least one material suitable for use as barrier to selectively remove portions of additional parallel line structures 114 of the patterned masking material 106, as described in further detail below. The material composition of the mask 112 may at least partially depend on the material composition of the additional parallel line structures 114 of the patterned masking material 106, and on the characteristics (e.g., etchant) of the material removal process to be employed with the mask 112. By way of non-limiting example, the mask 112 may be formed of and include at least one of amorphous carbon, silicon, a silicon oxide, a silicon nitride, a silicon oxycarbide, aluminum oxide, and a silicon oxynitride. The mask 112 may be homogeneous (e.g., may comprise a single material layer), or may be heterogeneous (e.g., may comprise a stack exhibiting at least two different material layers). FIG. 2B is a simplified, partial cross-sectional view of the semiconductor device structure 100 about the line A-A (FIG. 2A) at the processing stage depicted in FIG. 2A.

The mask 112 exhibits a desired pattern to be transferred into the additional parallel line structures 114 of the patterned masking material 106. For example, as shown in FIG. 2A, the mask 112 may include additional parallel line structures 114 separated from one another by parallel linear apertures 116 (e.g., parallel linear openings, parallel linear trenches). Each of the additional parallel line structures 114 of the mask 112 may have substantially the same width (e.g., minor lateral dimension), and may be regularly spaced by substantially the same distance (corresponding to a width of each of the parallel linear apertures 116). Accordingly, a pitch between centerlines of laterally-neighboring additional parallel line structures 114 may be substantially uniform throughout the mask 112. The dimensions and spacing of the additional parallel line structures 114 (and, hence, of the parallel linear apertures 116) of patterned masking material 106 may be selected to provide desired lateral dimensions, lateral shapes, and lateral spacing to features to be formed from the additional parallel line structures 114, which may, in turn be selected to provide desired lateral dimensions and lateral shapes to features formed from the hard mask material 104 and the semiconductive material 102 when accounting for ARDE effects, as described in further detail below. In some embodiments, the width of each of the additional parallel line structures 114 of the mask 112 is greater than the width of each of the parallel line structures 108 of the patterned masking material 106, and the distance between laterally-neighboring additional parallel line structures 114 of the mask 112 (e.g., corresponding to a width of each of the parallel linear apertures 116) is substantially the same as the distance between laterally-neighboring parallel line structures 108 of the patterned masking material 106.

As shown in FIG. 2A, the additional parallel line structures 114 and the parallel linear apertures 116 of the mask 112 may each be formed at a second angle α relative to the first lateral direction (e.g., the X-direction) different than (e.g., less than, greater than) the first angle θ of the parallel line structures 108 and the parallel linear trenches 110 of the patterned masking material 106. The second angle α may be selected in view of the first angle θ based on a desired architecture of the semiconductor device structure 100, and based on desired lateral dimensions and lateral shapes to features to be formed from the additional parallel line structures 114, which may, in turn be selected to provide desired lateral dimensions and desired lateral shapes to features formed from the hard mask material 104 and the semiconductive material 102 (FIG. 2B) when accounting for ARDE effects. For example, the second angle α may be selected relative to the first angle θ to control lateral dimensions and lateral positions of intersections between the parallel linear trenches 110 of the patterned masking material 106 and additional parallel linear trenches to be formed in the patterned masking material 106 using the mask 112. The lateral dimensions and the lateral positions of such intersections may affect the amounts and positions of the hard mask material 104 removed during subsequent ARDE using remaining portions of the parallel line structures 108, so as to affect the lateral dimensions and the lateral shapes of features formed from the hard mask material 104 through the ARDE as well as the lateral dimensions and the lateral shapes of features to be subsequently formed from the semiconductive material 102 (FIG. 2B) using such features formed from the hard mask material 104. In some embodiments, the second angle α of the additional parallel line structures 114 and the parallel linear apertures 116 is about forty-one (41) degrees.

In additional embodiments, the mask 112 may exhibit a different configuration than that depicted in FIG. 2A. By way of non-limiting example, the mask 112 may exhibit multiple series of discrete, elongate (e.g., non-circular, non-equilateral) apertures (e.g., ovular apertures, rectangular apertures) in place of each of the parallel linear apertures 116. The discrete, elongate apertures may be laterally surrounded and defined by a single, continuous mask structure in place of the additional parallel line structures 114. The discrete, elongate apertures of each series may be substantially aligned with one another, and may individually and collectively have substantially the same orientation (e.g., the same second angle α relative to the X-direction) as the parallel linear apertures 116 shown in FIG. 2A. Each discrete, elongate aperture of each series of the discrete, elongate apertures may individually be laterally positioned to vertically overlie a portion of one of the parallel line structures 108 of the patterned masking material 106. As such, the discrete, elongate apertures (as well as the single, continuous mask structure laterally surrounding and defining the discrete, elongate apertures) may facilitate the selective removal of portions of the parallel line structures 108 of the patterned masking material 106 in a manner substantially similar to that of parallel linear apertures 116.

With returned reference to FIG. 2A, the mask 112, including the additional parallel line structures 114 and the parallel linear apertures 116 thereof, may be formed and positioned using conventional processes (e.g., conventional deposition processes, such as one or more of in situ growth, spin-on coating, blanket coating, CVD, ALD, and PVD; conventional photolithography processes; conventional material removal processes; conventional alignment processes) and conventional processing equipment, which are not described in detail herein.

Figure 3A:
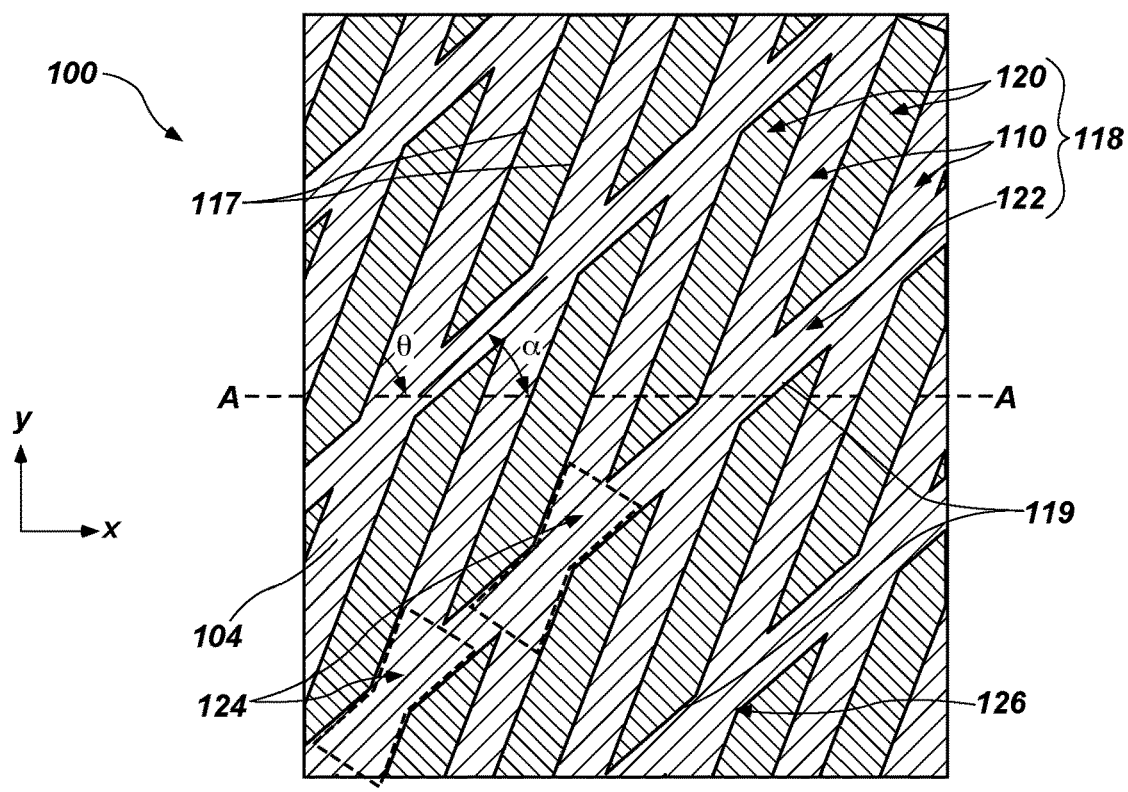
Figure 3B:
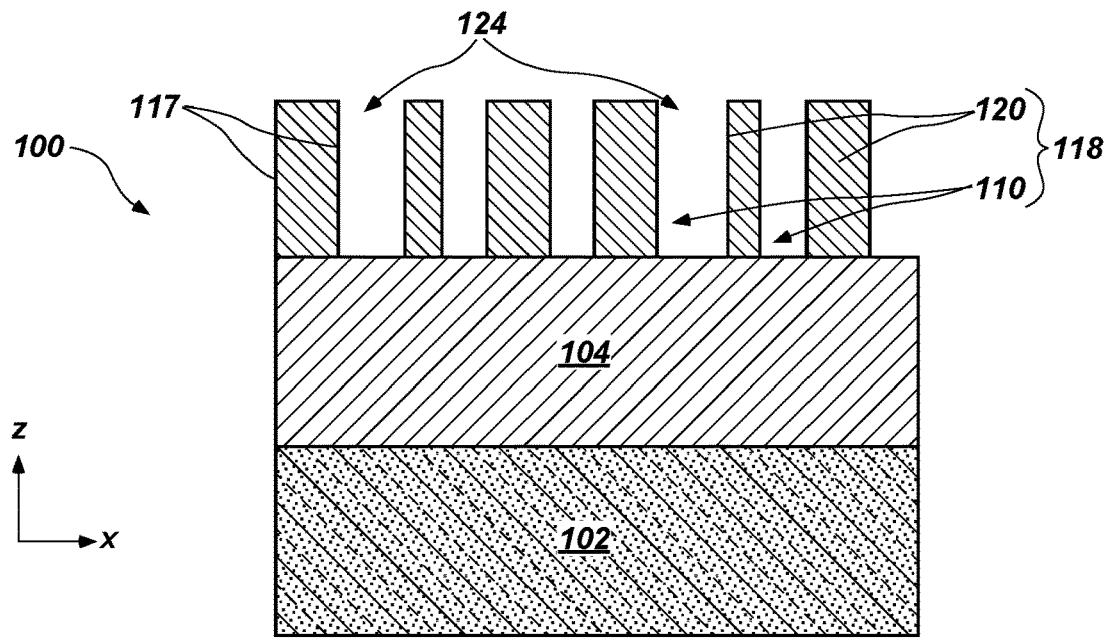

Referring next to FIG. 3A, portions of the parallel line structures 108 (FIGS. 2A and 2B) of the patterned masking material 106 (FIGS. 2A and 2B) remaining uncovered by the additional parallel line structures 114 (FIGS. 2A and 2B) of the mask 112 (FIGS. 2A and 2B) may be subjected to at least one material removal process to form a patterned masking structure 118. As shown in FIG. 3A, the patterned masking structure 118 may include elongate pillar structures 120, the parallel linear trenches 110, and additional parallel linear trenches 122. The elongate pillar structures 120 may be separated from one another in one lateral direction by the parallel linear trenches 110, and may be separated from one another in an additional lateral direction by the additional parallel linear trenches 122. The elongate pillar structures 120 may each exhibit a parallelogram lateral cross-sectional shape. The elongate pillar structures 120 may each individually include first opposing side surfaces 117 extending parallel to one another at the first angle θ, second opposing side surfaces 119 extending parallel to one another at the second angle α, and tips 126 (e.g., corners, such as angled corners) intervening between the first opposing side surfaces 117 and the second opposing side surfaces 119. In addition, as shown in FIG. 3A, following the formation of the patterned masking structure 118, the mask 112 (FIGS. 2A and 2B) may be removed. FIG. 3B is a simplified, partial cross-sectional view of the semiconductor device structure 100 about the line A-A (FIG. 3A) at the processing stage depicted in FIG. 3A.

As shown in FIG. 3A, intersections (e.g., junctions, crossings) between the parallel linear trenches 110 and the additional parallel linear trenches 122 of the patterned masking structure 118 may define overlapping trench regions 124 (shown with dashed lines in FIG. 3A) laterally intervening between the tips 126 of laterally-neighboring elongate pillar structures 120. The lateral shapes and the lateral dimensions of the overlapping trench regions 124 at least partially depend on the first angle θ of the parallel linear trenches 110 and the second angle α of the additional parallel linear trenches 122. Lateral separation between laterally-neighboring elongate pillar structures 120 within the lateral boundaries of the overlapping trench regions 124 may be greater than lateral separation between laterally-neighboring elongate pillar structures 120 outside of the lateral boundaries of the overlapping trench regions 124. The overlapping trench regions 124 may effectively act as larger critical dimension openings laterally adjacent smaller critical dimension openings (e.g., openings defined by non-intersecting portions of the parallel linear trenches 110 and the additional parallel linear trenches 122). Accordingly, during subsequent ARDE of the hard mask material 104, portions of the hard mask material 104 underlying the overlapping trench regions 124 may be removed (e.g., vertically etched) at different rates than other portions of the hard mask material 104 not underlying the overlapping trench regions 124. Such removal rate variability may effectuate the formation of features having regions exhibiting variable lateral dimensions throughout the heights (e.g., vertical dimensions) thereof, as described in further detail below.

The material removal process employed to form the patterned masking structure 118 may comprise a conventional anisotropic etching process employing an etchant selective to the material of the parallel line structures 108 (FIGS. 2A and 2B) of the patterned masking material 106 (FIGS. 2A and 2B), which is not described in detail herein. For example, depending on the material composition of the parallel line structures 108 (FIGS. 2A and 2B), the material removal process may comprise exposing portions of the parallel line structures 108 (FIGS. 2A and 2B) to one or more of anisotropic dry etching (e.g., reactive ion etching (RIE), deep RIE, plasma etching, reactive ion beam etching, chemically assisted ion beam etching) and anisotropic wet etching (e.g., hydrofluoric acid (HF) etching, a buffered HF etching, buffered oxide etching). In addition, remaining portions of the mask 112 (FIGS. 2A and 2B) may be selectively removed following the formation of the patterned masking structure 118 using one or more other conventional material removal processes (e.g., a conventional wet etching process, a conventional dry etching process), which are not described in detail herein.

Figure 4A:
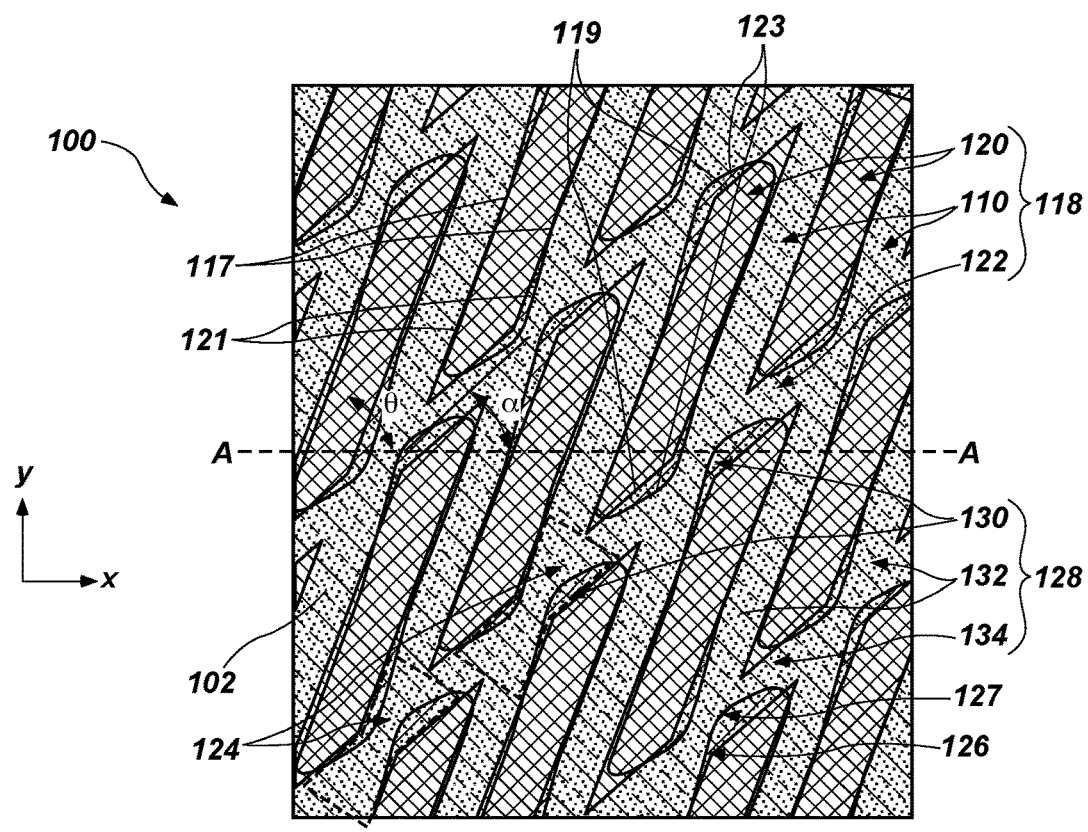
Figure 4B:
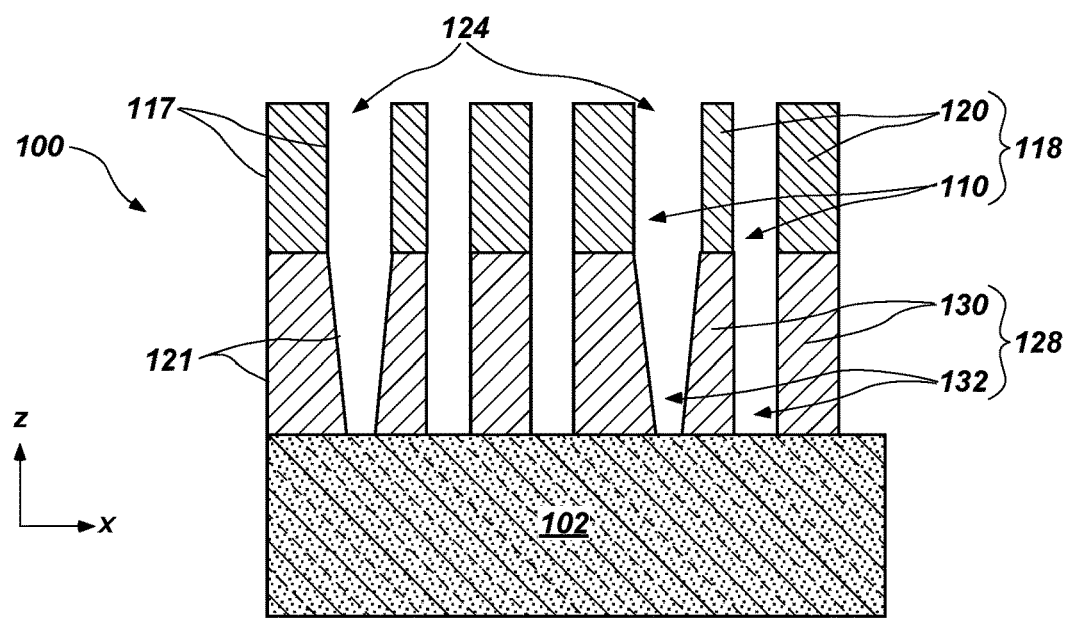

Referring next to FIG. 4A, portions of the hard mask material 104 (FIGS. 3A and 3B) remaining uncovered by the elongate pillar structures 120 of the patterned masking structure 118 may be removed through ARDE to form a patterned hard mask material 128. As shown in FIG. 3A, the patterned hard mask material 128 may include elongate hard mask structures 130, first trenches 132, and second trenches 134. The elongate hard mask structures 130 may be separated from one another in one lateral direction by the first trenches 132, and may be separated from one another in different lateral direction by the second trenches 134. The elongate hard mask structures 130 may each individually include first opposing side surfaces 121, second opposing side surfaces 123, and tips 127 (e.g., corners, such as radiused corners) intervening between the first opposing side surfaces 121 and the second opposing side surfaces 123. FIG. 4B is a simplified, partial cross-sectional view of the semiconductor device structure 100 about the line A-A (FIG. 4A) at the processing stage depicted in FIG. 4A.

As shown in FIGS. 4A and 4B, portions of the elongate hard mask structures 130 may be located vertically below and within the lateral boundaries of the overlapping trench regions 124 of the patterned masking structure 118 following the ARDE of the hard mask material 104 (FIGS. 3A and 3B). For example, one or more portions of one or more of the first opposing side surfaces 121, the second opposing side surfaces 123, and the tips 127 of the elongate hard mask structures 130 may vertically underlie and be within the lateral boundaries of the overlapping trench regions 124 of the patterned masking structure 118. As shown in FIG. 4B, portions of one or more of the first opposing side surfaces 121 of the elongate hard mask structures 130 vertically below and within the lateral boundaries of the overlapping trench regions 124 may be tapered (e.g., angled) with respect to an upper surface of the semiconductive material 102, such that vertically lower regions of the portions of the first opposing side surfaces 121 inwardly laterally extend (e.g., laterally protrude) farther into the areas underlying the overlapping trench regions 124 than vertically higher regions of the portions of the first opposing side surfaces 121. In some embodiments, portions of the first opposing side surfaces 121 of the elongate hard mask structures 130 vertically underlying and within the lateral boundaries of the overlapping trench regions 124 have at least one angle less than 90° relative to the upper surface of the semiconductive material 102, such as an angle between about 80° and about 90°. Portions of the second opposing side surfaces 123 (FIG. 4A) and the tips 127 (FIG. 4A) of the elongate hard mask structures 130 located vertically below and within the lateral boundaries of the overlapping trench regions 124 may exhibit tapering similar to that of the portions of the first opposing side surfaces 121 of the elongate hard mask structures 130 vertically below and within the lateral boundaries of the overlapping trench regions 124. Other portions of the first opposing side surfaces 121, the second opposing side surfaces 123, and the tips 127 of the elongate hard mask structures 130 outside of the lateral boundaries of the overlapping trench regions 124 of the patterned masking structure 118 may exhibit less tapering, such that the other portions have angles closer to 90° relative to the upper surface of the semiconductive material 102. As such, vertically lower regions of portions of laterally-neighboring elongate hard mask structures 130 vertically underlying and within the lateral boundaries of the overlapping trench regions 124 of the patterned masking structure 118 may be closer together (e.g., less laterally separated) than vertically lower regions of other portions of laterally-neighboring elongate hard mask structures 130 not vertically underlying and within the lateral boundaries of the overlapping trench regions 124. The tapering of the portions of the first opposing side surfaces 121, the second opposing side surfaces 123, and the tips 127 of the elongate hard mask structures 130 vertically underlying and within the lateral boundaries of the overlapping trench regions 124 of the patterned masking structure 118 may result from relatively increased passivation of surfaces of the hard mask material 104 (FIGS. 3A and 3B) within the lateral boundaries of the overlapping trench regions 124 during the ARDE employed to form the elongate hard mask structures 130.

Figure 5A:
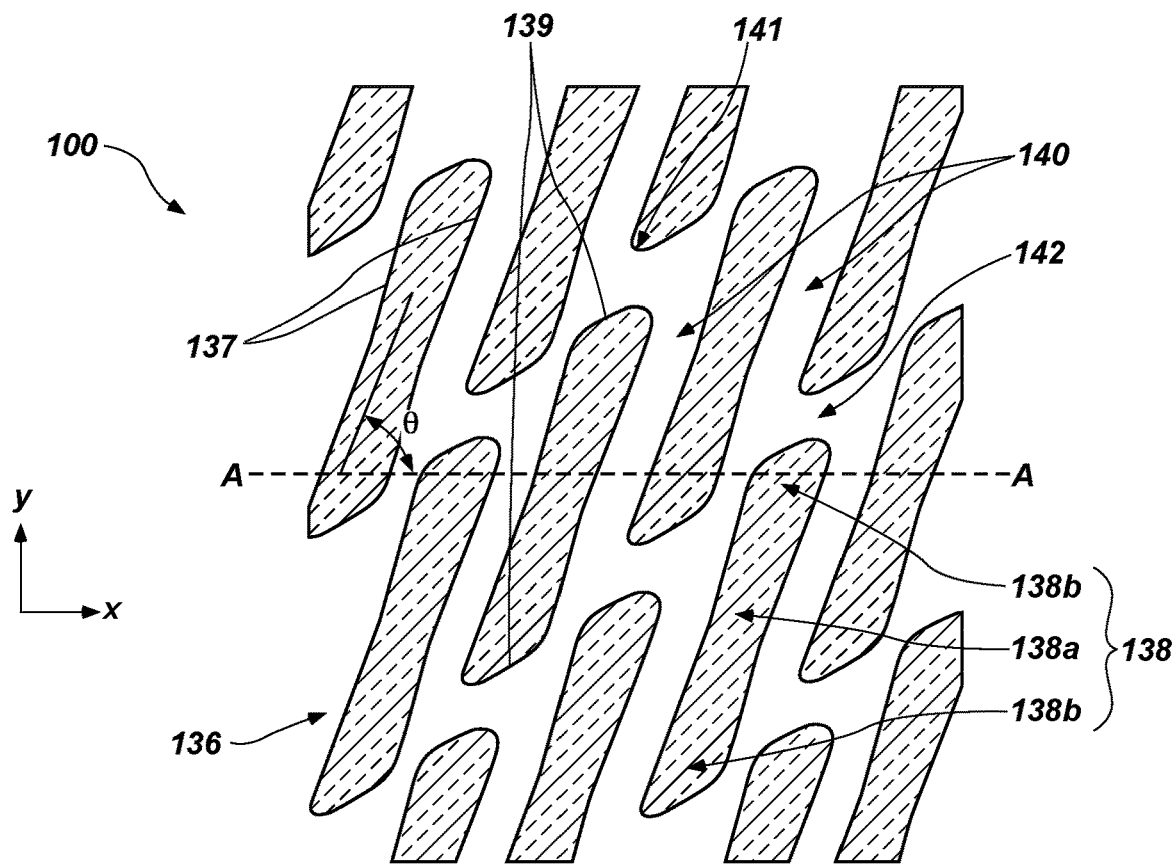
Figure 5B:
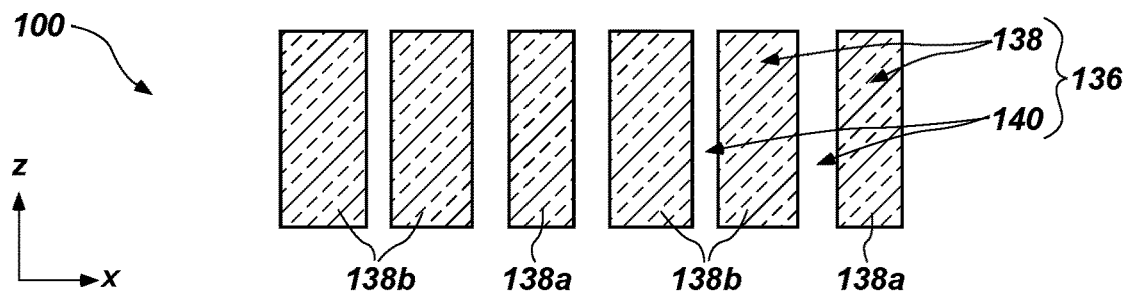

Referring next to FIG. 5A, portions of the semiconductive material 102 (FIG. 4B) remaining uncovered by the elongate hard mask structures 130 (FIGS. 4A and 4B) of the patterned hard mask material 128 may be selectively removed to form a patterned semiconductive material 136. As shown in FIG. 5A, the patterned semiconductive material 136 may include elongate semiconductive pillars 138, first trenches 140, and second trenches 142. The elongate semiconductive pillars 138 may be separated from one another in a first lateral direction by the first trenches 140, and may be separated from one another in a second, different lateral direction by the second trenches 142. The elongate semiconductive pillars 138 may each individually include first opposing side surfaces 137, second opposing side surfaces 139, and tips 141 (e.g., corners, such as radiused corners) intervening between the first opposing side surfaces 137 and the second opposing side surfaces 139. In addition, as shown in FIG. 5A, following the formation of the patterned semiconductive material 136, remaining portions (if any) of the patterned hard mask material 128 (FIGS. 4A and 4B) and the patterned masking structure 118 (FIGS. 4A and 4B) may be removed. FIG. 5B is a simplified, partial cross-sectional view of the semiconductor device structure 100 about the line A-A (FIG. 5A) at the processing stage depicted in FIG. 5A.

As shown in FIG. 5A, each of the elongate semiconductive pillars 138 may include a digit line (e.g., bit line) contact region 138a, and storage node (e.g., memory cell) contact regions 138b. The storage node contact regions 138b may be located proximate the second opposing side surfaces 139 of each of the elongate semiconductive pillars 138, and the digit line contact region 138a may be located laterally between the storage node contact regions 138b and proximate a center of each of the elongate semiconductive pillars 138. For some of elongate semiconductive pillars 138 laterally-neighboring one another in the X-direction, the digit line contact region 138a of one of the laterally-neighboring elongate semiconductive pillars 138 may be located laterally adjacent one of the storage node contact regions 138b of another of the laterally-neighboring elongate semiconductive pillars 138.

The storage node contact regions 138b of each of the elongate semiconductive pillars 138 may each individually exhibit greater lateral dimensions than the digit line contact region 138a therebetween. The storage node contact regions 138b may be wider (e.g., have a greater minor lateral dimension) than the digit line contact region 138a, such that first opposing side surfaces 137 of elongate semiconductive pillars 138 are each substantially non-coplanar. The storage node contact regions 138b may exhibit greater lateral cross-sectional areas relative to those of conventional storage node contact regions of many conventional semiconductive pillars. The lateral geometric configurations (e.g., lateral shapes, lateral dimensions) of the elongate semiconductive pillars 138 may increase storage node (e.g., memory cell) alignment margins, may improve storage node contact area, may permit increased storage node lateral dimensions, and/or may reduce risks of shorts and junction leakage as compared to conventional semiconductive pillar lateral geometric configurations. The lateral shapes and lateral dimensions of the elongate semiconductive pillars 138 (including the lateral shapes and the lateral dimensions of the storage node contact regions 138b and the digit line contact regions 138a thereof) may correspond to the lateral shapes and the lateral dimensions of the vertically lowermost regions of the elongate hard mask structures 130 (FIGS. 4A and 4B) employed to form the elongate semiconductive pillars 138. Accordingly, the lateral shapes and the lateral dimensions of the overlapping trench regions 124 (FIGS. 4A and 4B) of the patterned masking structure 118 (FIGS. 4A and 4B), as influenced by the first angle θ of the parallel linear trenches 110 (FIGS. 4A and 4B) and the second angle α of the additional parallel linear trenches 122 (FIGS. 4A and 4B), facilitate control of ARDE effects during the formation of the elongate hard mask structures 130 (FIGS. 4A and 4B) so as to permit desirable and pre-determined manipulation of the lateral shapes and the lateral dimensions of the elongate semiconductive pillars 138.

Thus, in accordance with embodiments of the disclosure, a method of forming a semiconductor device comprises forming a patterned masking material over a hard mask material overlying a semiconductive material. The patterned masking material comprises parallel line structures and parallel linear trenches each laterally extending at a first angle within a range of from about 30 degrees to about 75 degrees relative to a first lateral direction. A mask is provided over the patterned masking material. The mask comprises additional parallel line structures and parallel linear apertures each laterally extending at a second angle different than the first angle and within a range of from about 0 degrees to about 90 degrees relative to the first lateral direction. The patterned masking material is further patterned using the mask to form a patterned masking structure comprising elongate pillar structures separated from one another by the parallel linear trenches laterally extending at the first angle and additional parallel linear trenches laterally extending at the second angle. Overlapping regions of the parallel linear trenches and additional parallel linear trenches are located laterally adjacent corners of the elongate pillar structures. Portions of the hard mask material not covered by the elongate pillar structures are subjected to aspect ratio dependent etching to form a patterned hard mask material comprising elongate hard mask structures exhibiting portions vertically underlying and within lateral boundaries of the overlapping regions of the parallel linear trenches and the additional parallel linear trenches of the patterned masking structure. Portions of the semiconductive material not covered by the elongate hard mask structures are removed to form a patterned semiconductive material comprising elongate semiconductive pillar structures.

Furthermore, a semiconductor device according to embodiments of the disclosure comprises elongate semiconductive pillars each individually comprising a digit line contact region disposed laterally between two storage node contact regions. Each of the two storage node contact regions has a larger width than the digit line contact region.

Figure 6A:
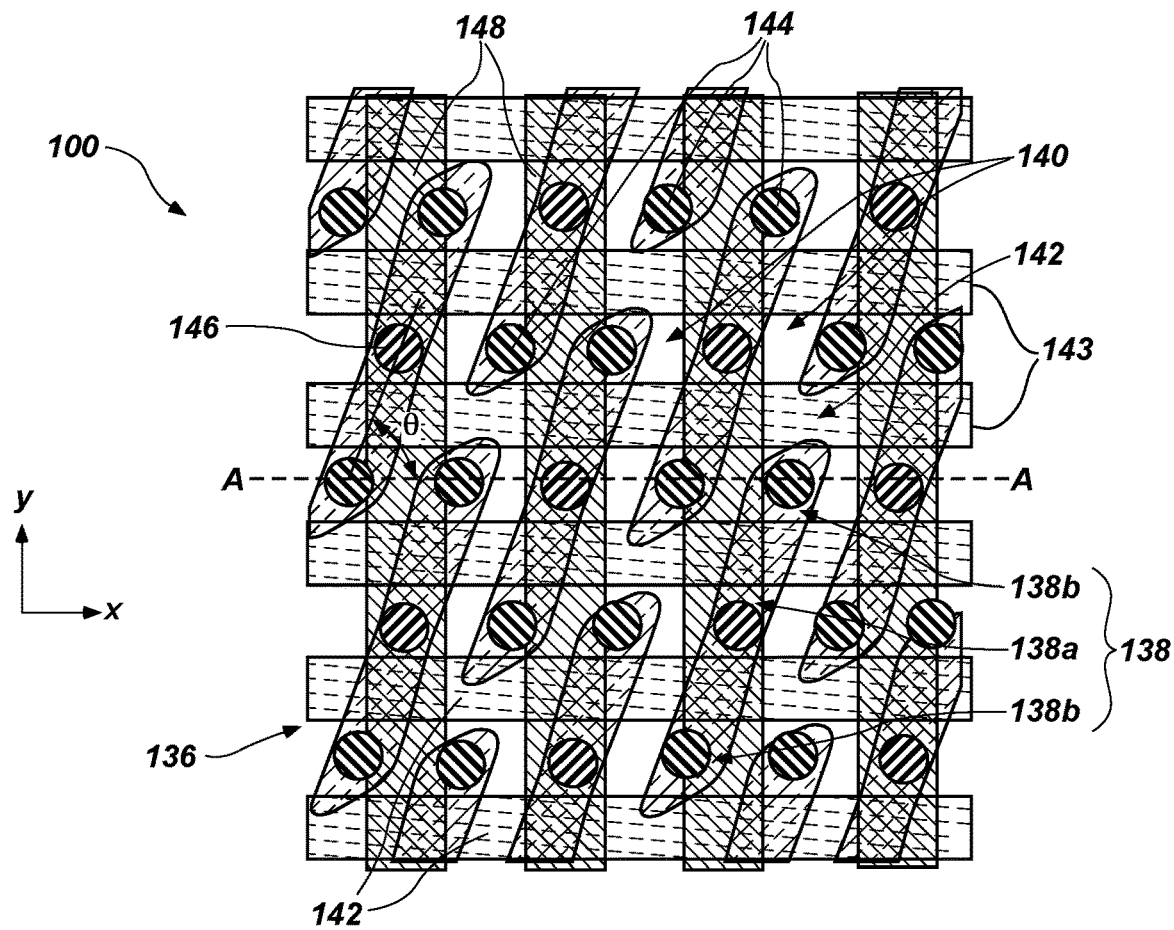
Figure 6B:
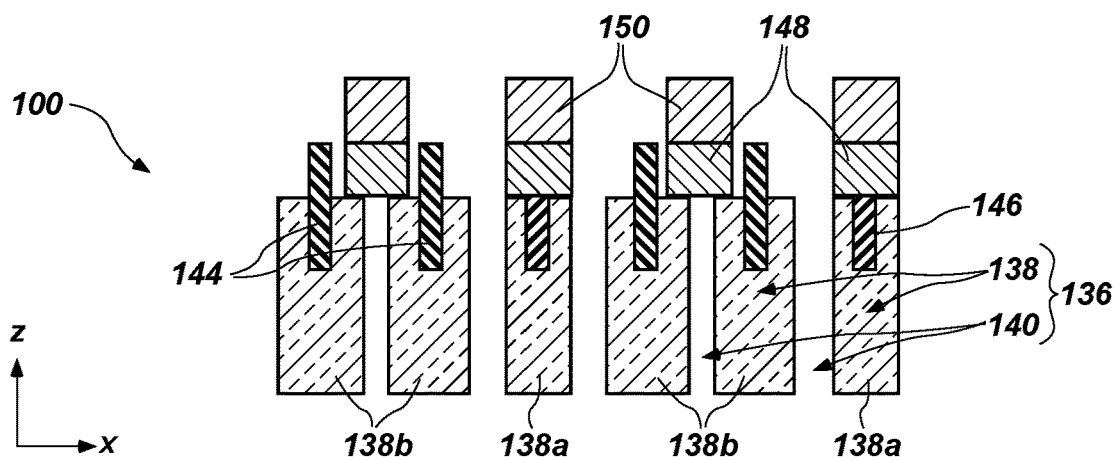

Following the formation of the elongate semiconductive pillars 138, the semiconductor device structure 100 may be subjected to additional processing. By way of non-limiting example, referring collectively to FIG. 6A, the storage node contact regions 138b and the digit line contact region 138a of each of the elongate semiconductive pillars 138 may be separated from one another by isolation trenches having word lines 143 formed therein. In addition, storage node contacts 144 may be formed in the storage node contact regions 138b of the elongate semiconductive pillars 138, digit line contacts 146 may be formed in the digit line contact regions 138a of the elongate semiconductive pillars 138, and digit lines 148 may be formed on or over the digit line contacts 146. The word lines 143 may extend in a first lateral direction (e.g., the X-direction) and the digit lines 148 may extend in a second, different lateral direction (e.g., the Y-direction). Moreover, one or more isolation materials (e.g., dielectric materials) may be formed in spaces (e.g., first trenches 140, the second trenches 142, additional openings) between features of the semiconductor device structure 100. Furthermore, as shown in FIG. 6B, which is a simplified, partial cross-sectional view of the semiconductor device structure 100 about the line A-A (FIG. 6A) at the processing stage depicted in FIG. 6A, dielectric cap structures 150 (e.g., nitride dielectric cap structures) may be formed on or over the digit line contacts 146.

The word lines 143, the storage node contacts 144, the digit line contacts 146, and the digit lines 148 may each individually be formed of and include at least one electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the word lines 143, storage node contacts 144, the digit line contacts 146, and the digit lines 148 may each individually comprise one or more of titanium nitride (TiN), tantalum nitride (TaN), tungsten nitride (WN), titanium aluminum nitride (TiAlN), elemental titanium (Ti), elemental platinum (Pt), elemental rhodium (Rh), elemental iridium (Ir), iridium oxide (IrO$_x$), elemental ruthenium (Ru), ruthenium oxide (RuO$_x$), and alloys thereof.

The word lines 143, the storage node contacts 144, the digit line contacts 146, and the digit lines 148 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

Figure 7A:
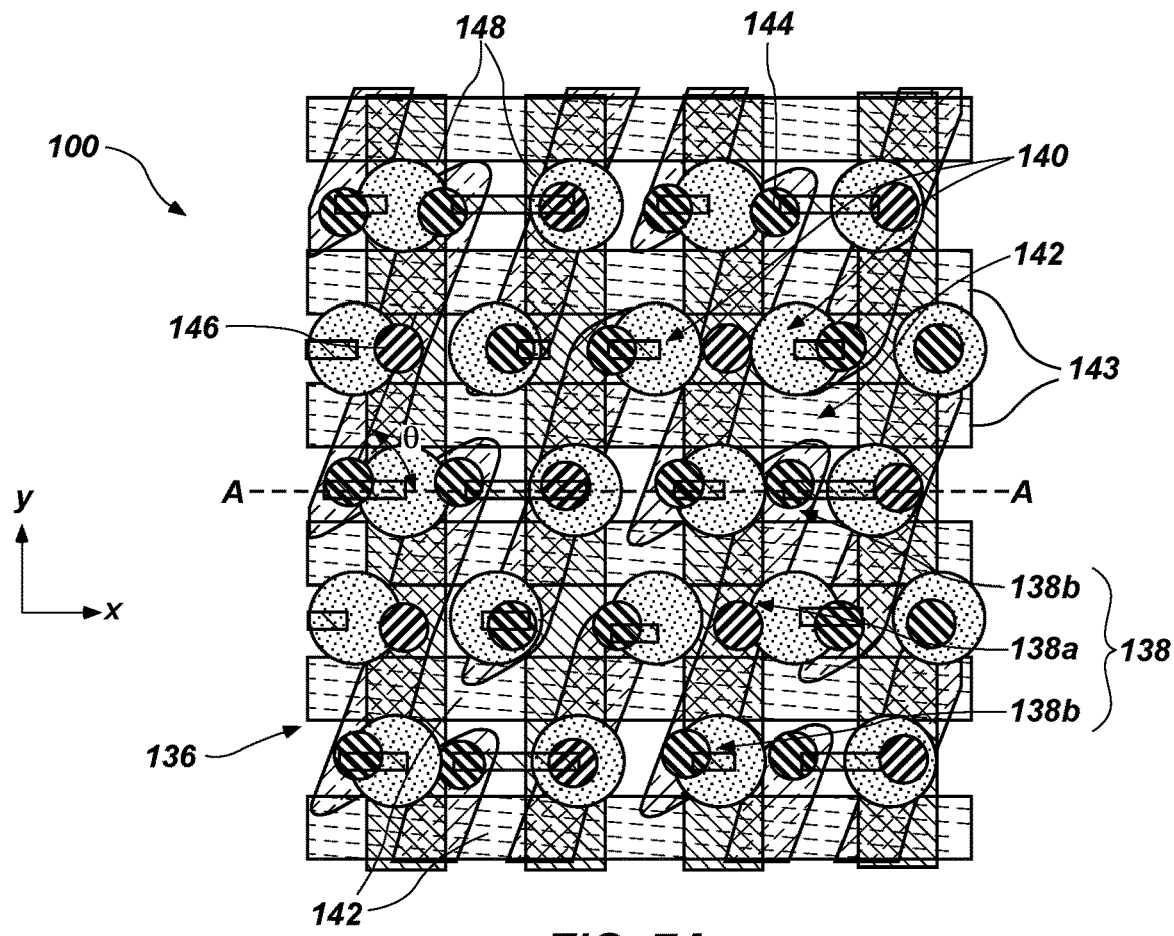
Figure 7B:
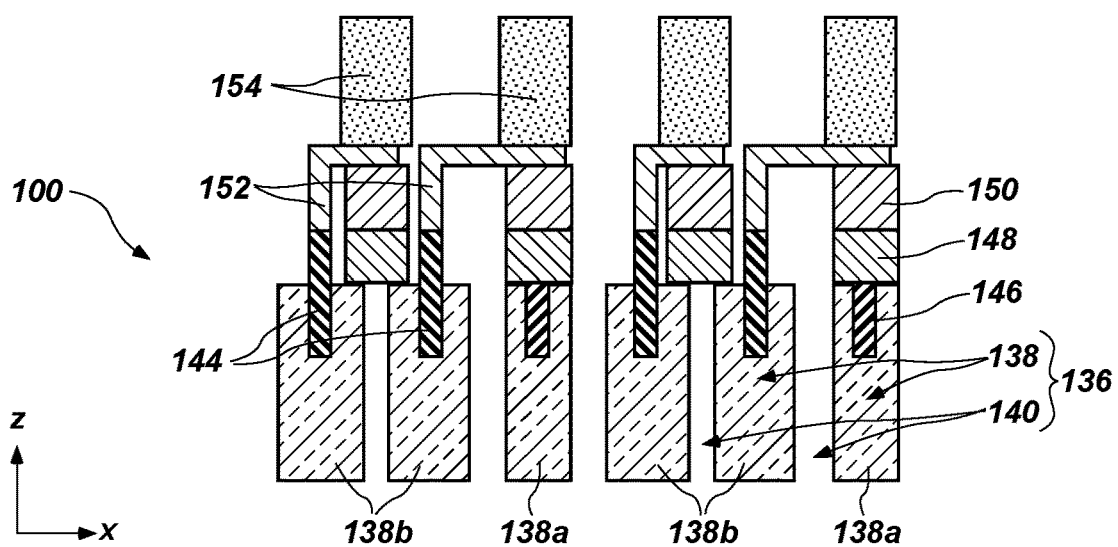

Referring next to FIG. 7A, redistribution material (RDM) structures 152 (also referred to as "redistribution layer (RDL) structures") may be formed on or over the storage node contacts 144, and storage node structures 154 (e.g., capacitor structures) may be formed over and in electrical communication with the RDM structures 152. FIG. 7B is a simplified, partial cross-sectional view of the semiconductor device structure 100 about the line A-A (FIG. 7A) at the processing stage depicted in FIG. 7A.

The RDM structures 152 may be configured to effectively shift (e.g., stagger, adjust, modify) lateral positions (e.g., in the X-direction) of the storage node contacts 144 to accommodate a desired arrangement (e.g., a hexagonal close packed arrangement) of the storage node structures 154 over and in electrical communication with the storage node contacts 144. The RDM structures 152 may each individually be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the RDM structures 152 may individually comprise one or more of TiN, TaN, WN, TiAlN, Ti, Pt, Rh, Ir, IrO$_x$, Ru, RuO$_x$, and alloys thereof.

The storage node structures 154 may be configured to store a charge representative of a programmable logic state. For example, a charged state of the storage node structures 154 may represent a first logic state (e.g., a logic 1), and an uncharged state of the storage node structures 154 may represent a second logic state (e.g., a logic 0). In some embodiments, the storage node structures 154 comprise a dielectric material configured to storage a charge associated with a logic state. The dielectric material may, for example, comprise one or more of include silicon dioxide, silicon nitride, polyimide, titanium dioxide (TiO$_2$), tantalum oxide (Ta$_2$O$_5$), aluminum oxide (Al$_2$O$_3$), an oxide-nitride-oxide material (e.g., silicon dioxide-silicon nitride-silicon dioxide), strontium titanate (SrTiO$_3$) (STO), barium titanate (BaTiO$_3$), hafnium oxide (HfO$_2$), zirconium oxide (ZrO$_2$), a ferroelectric material (e.g., ferroelectric hafnium oxide, ferroelectric zirconium oxide, lead zirconate titanate (PZT), etc.), and a high-k dielectric material. In some embodiments, the storage node structures 154 comprise zirconium oxide.

The RDM structures 152 and the storage node structures 154 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

With returned reference to FIGS. 5A and 5B, in additional embodiments, the semiconductor device structure 100 is formed to exhibit different lateral geometric configurations (e.g., different lateral shapes, different lateral dimensions) of the elongate semiconductive pillars 138 by modifying one or more of the first angle θ of the parallel line structures 108 (FIGS. 1A and 1B) and parallel linear trenches 110 (FIGS. 1A and 1B) of the patterned masking material 106, and the second angle α of the additional parallel line structures 114 (FIGS. 2A and 2B) and the parallel linear apertures 116 (FIGS. 2A and 2B) of the mask 112 (FIGS. 2A and 2B). By way of non-limiting example, FIGS. 8A through 9E are simplified partial top-down views illustrating embodiments of methods of forming additional semiconductor device structures of the disclosure. To avoid repetition, not all features shown in FIGS. 8A through 9E are described in detail herein. Rather, unless described otherwise below, a feature designated by a reference numeral that is a 100 increment of the reference numeral of a previously-described feature (whether the previously-described feature is first described before the present paragraph, or is first described after the present paragraph) will be understood to be substantially similar to the previously-described feature and will also be understood to be formed in substantially the same manner as the previously-described feature.

Figure 8A:
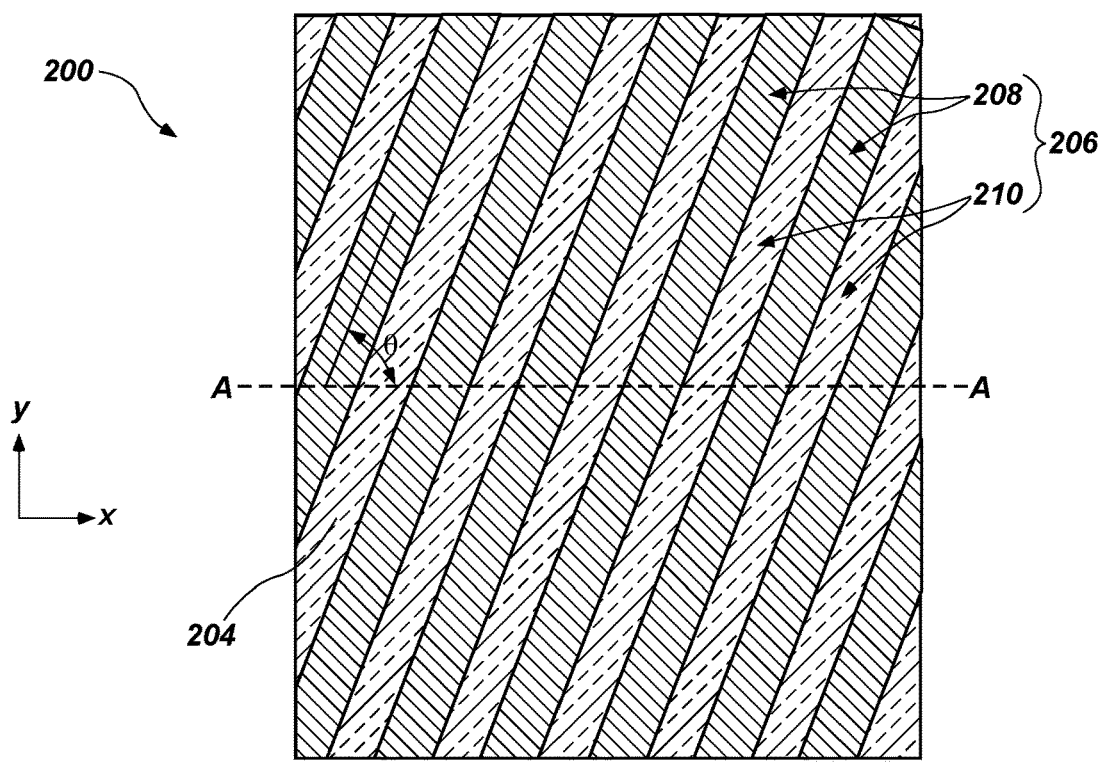
FIGS. 8A through 8E are simplified partial top-down views illustrating a method of forming another semiconductor device structure, in accordance with additional embodiments of the disclosure.

In accordance with additional embodiments of the disclosure, FIGS. 8A through 8E are simplified partial top-down views illustrating a method of forming a semiconductor device structure 200. Referring to FIG. 8A, a semiconductor device structure 200 may include a patterned masking material 206 on or over a hard mask material 204. The hard mask material 204 may be positioned on or over a semiconductor material substantially similar to the semiconductive material 102 previously described with reference to FIG. 1B. As shown in FIG. 8A, the patterned masking material 206 may include parallel line structures 208 separated from one another by parallel linear trenches 210, wherein the configurations of the parallel line structures 208 and parallel linear trenches 210 are respectively substantially similar to those of parallel line structures 108 and parallel linear trenches 110 previously described with reference to FIGS. 1A and 1B. In some embodiments, the parallel line structures 208 and parallel linear trenches 210 are each formed at a first angle θ offset from a first lateral direction (e.g., the X-direction) by about sixty-nine (69) degrees.

Figure 8B:
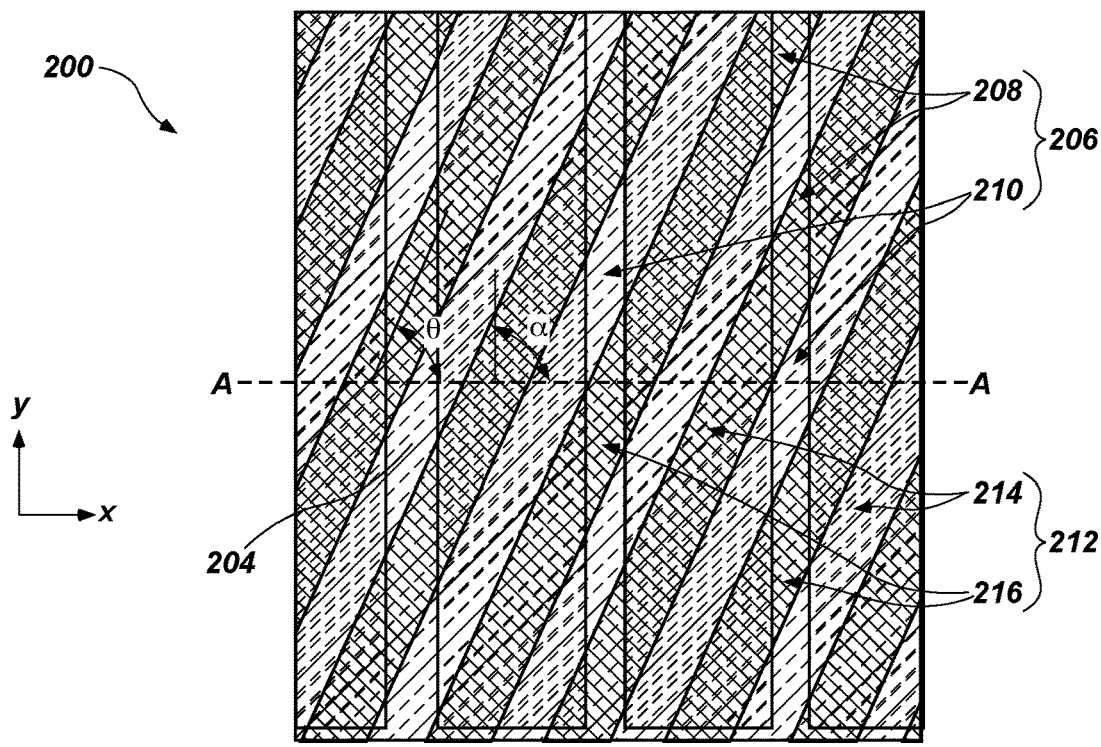

Referring to next to FIG. 8B, a mask 212 (e.g., an etch mask, a chop mask) including additional parallel line structures 214 and parallel linear apertures 216 may be provided on or over the patterned masking material 206. The additional parallel line structures 214 and the parallel linear apertures 216 may respectively be substantially similar to the additional parallel line structures 114 and the parallel linear apertures 116 of the mask 112 previously described with reference to FIGS. 2A and 2B, except that the additional parallel line structures 214 and the parallel linear apertures 216 may be oriented at a different second angle α relative to the first lateral direction (e.g., X-direction) than the additional parallel line structures 114 (FIGS. 2A and 2B) and the parallel linear apertures 116 (FIGS. 2A and 2B). For example, the second angle α of the additional parallel line structures 214 and the parallel linear apertures 216 may be greater than forty-one (41) degrees, such as greater than forty-one (41) degrees and less than or equal to ninety (90) degrees. In some embodiments, the second angle α of the additional parallel line structures 214 and the parallel linear apertures 216 is about ninety (90) degrees. The different orientations (e.g., the different second angle α) of the additional parallel line structures 214 and the parallel linear apertures 216 relative to the additional parallel line structures 114 (FIGS. 2A and 2B) and the parallel linear apertures 116 (FIGS. 2A and 2B) affects the lateral dimensions and the lateral shapes of features formed from the hard mask material 204 through the ARDE as well as the lateral dimensions and the lateral shapes of features to be subsequently formed from the semiconductor material underlying the hard mask material 204 using such features formed from the hard mask material 204, as described in further detail below.

Figure 8C:
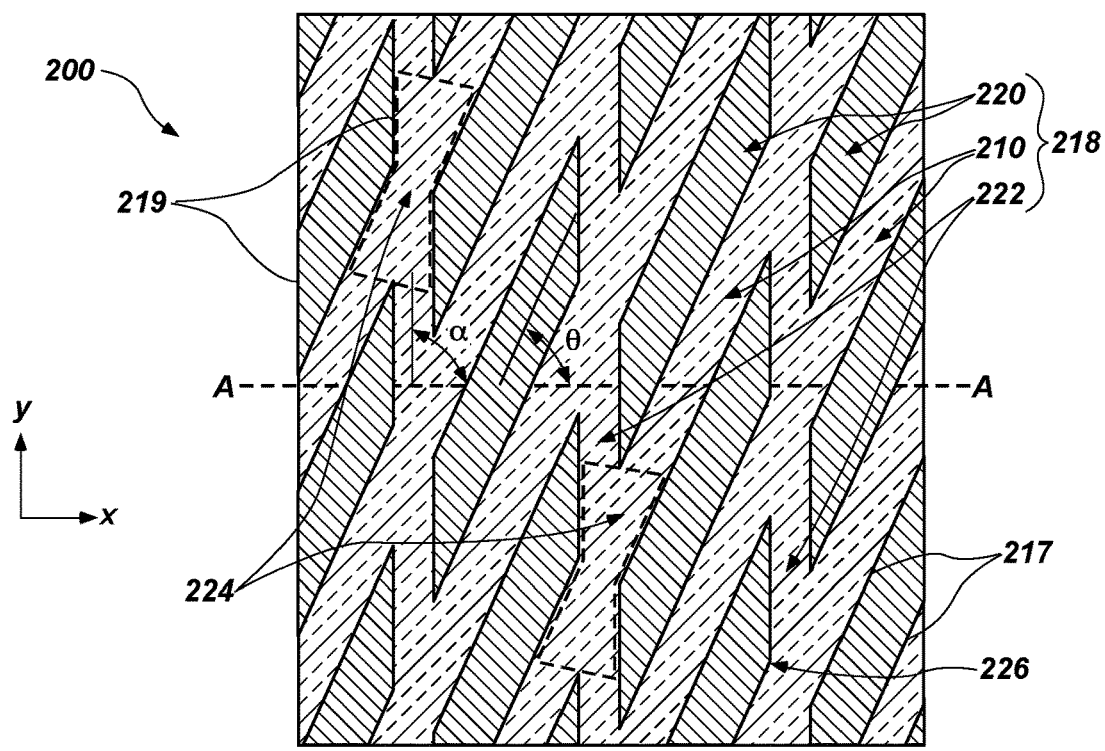

Next, referring to FIG. 8C, portions of the parallel line structures 208 (FIG. 8A) of the patterned masking material 206 (FIG. 8A) remaining uncovered by the additional parallel line structures 214 (FIG. 8B) of the mask 212 (FIG. 8B) may be subjected to at least one material removal process to form a patterned masking structure 218 including elongate pillar structures 220, the parallel linear trenches 210, and additional parallel linear trenches 222. The elongate pillar structures 220 may each exhibit a parallelogram lateral cross-sectional shape. In addition, the elongate pillar structures 220 may each individually include first opposing side surfaces 217 extending parallel to one another at the first angle θ, second opposing side surfaces 219 extending parallel to one another at the second angle α, and tips 226 (e.g., corners, such as angled corners) intervening between the first opposing side surfaces 217 and the second opposing side surfaces 219. As shown in FIG. 8C, the larger second angle α of the parallel linear apertures 216 (FIG. 8B) of the mask 212 (FIG. 8B) relative to that of the parallel linear apertures 116 (FIGS. 2A and 2B) of the mask 112 (FIGS. 2A and 2B) modifies the configurations of the intersections between the parallel linear trenches 210 and the additional parallel linear trenches 222 such that overlapping trench regions 224 defined by the intersections exhibit different lateral dimensions and lateral positioning relative to the elongate pillar structures 220. For example, the overlapping trench regions 224 laterally intervening between the tips 226 of laterally-neighboring elongate pillar structures 220 may laterally terminate closer to central regions of some of the laterally-neighboring elongate pillar structures 220. The relatively different configurations of the overlapping trench regions 224 may, in turn, modify the lateral shape and lateral dimensions of features subsequently formed from the hard mask material 204, as described in further detail below. For example, the modified configurations of the overlapping trench regions 224 (relative to the overlapping trench regions 124 of the patterned masking structure 218) may modify the locations and/or the magnitudes of regions of the subsequently-formed features exhibiting variable lateral dimensions throughout the heights (e.g., vertical dimensions) thereof.

Figure 8D:
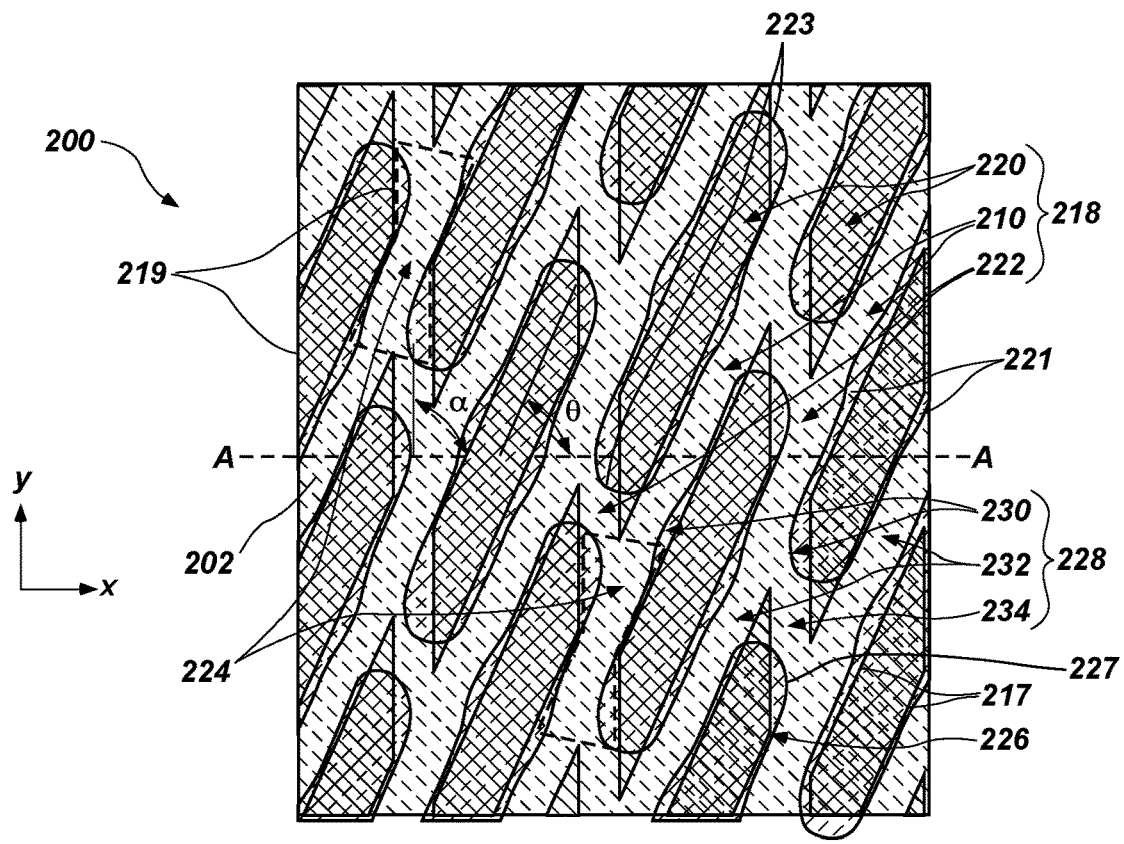

Referring next to FIG. 8D, portions of the hard mask material 204 (FIG. 8C) remaining uncovered by the elongate pillar structures 220 (FIG. 8C) of the patterned masking structure 218 may be removed through ARDE to form a patterned hard mask material 228 including elongate hard mask structures 230, first trenches 232, and second trenches 234. The elongate hard mask structures 230 may each individually include first opposing side surfaces 221, second opposing side surfaces 223, and tips 227 (e.g., corners, such as radiused corners) intervening between the first opposing side surfaces 221 and the second opposing side surfaces 223. As shown in FIG. 8D, as a result of the modified configurations of the overlapping trench regions 224 of the patterned masking structure 218 (relative to the overlapping trench regions 124 of the patterned masking structure 118 previously described with reference to FIGS. 4A and 4B), the lateral positions, lateral shapes, and lateral sizes of portions (e.g., vertically lower portions) of the elongate hard mask structures 230 of the patterned hard mask material 228 outwardly laterally extending beyond the lateral boundaries of the elongate pillar structures 220 of the patterned masking structure 218 may be different than the lateral positions, lateral shapes, and lateral sizes of portions (e.g., vertically lower portions) of the elongate pillar structures 120 (FIGS. 4A and 4B) of the patterned hard mask material 128 (FIGS. 4A and 4B) outwardly laterally extending beyond the lateral boundaries of the elongate pillar structures 120 (FIGS. 4A and 4B) of the patterned masking structure 118 (FIGS. 4A and 4B). For example, as a result of the different termination points of the overlapping trench regions 224, regions (e.g., vertically lower regions) of the first opposing side surfaces 221 of the elongate hard mask structures 230 located at central regions of the elongate hard mask structures 230 may laterally extend (e.g., laterally protrude) into the area underlying the overlapping trench regions 224 of the patterned masking structure 218.

Figure 8E:
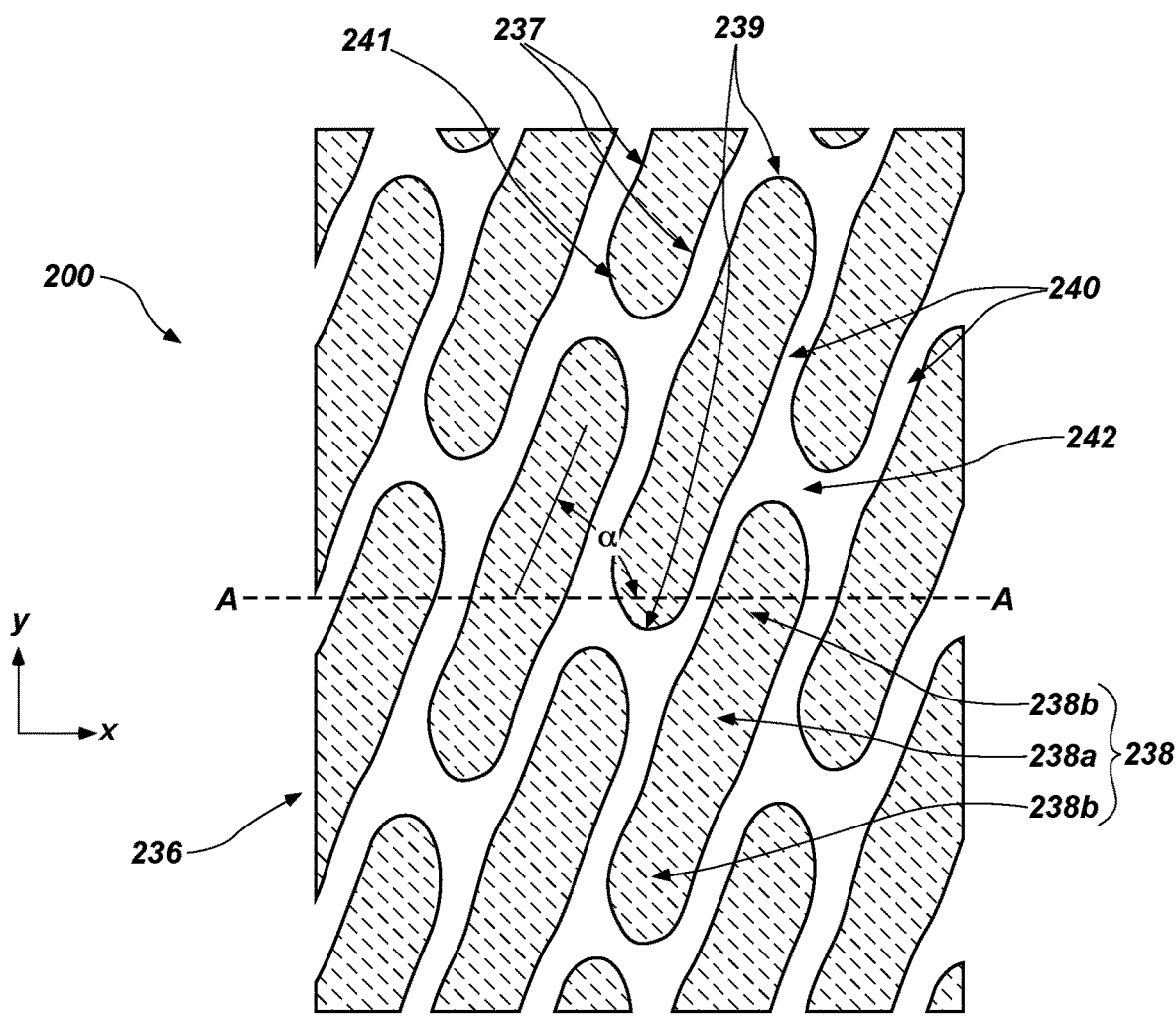

Next, referring to FIG. 8E, portions of a semiconductive material 202 (FIG. 8D) remaining uncovered by the elongate hard mask structures 230 (FIG. 8D) of the patterned hard mask material 228 (FIG. 8D) may be selectively removed to form a patterned semiconductive material 236 including elongate semiconductive pillars 238, first trenches 240, and second trenches 242. The elongate semiconductive pillars 238 may each individually include first opposing side surfaces 237, second opposing side surfaces 239, and tips 241 (e.g., corners, such as radiused corners) intervening between the first opposing side surfaces 237 and the second opposing side surfaces 239. In addition, the elongate semiconductive pillars 238 may each include storage node contact regions 238b proximate the second opposing side surfaces 239 thereof, and a digit line contact region 238a located laterally between the storage node contact regions 238b and proximate a center of the elongate semiconductive pillar 238. The lateral shapes and lateral dimensions of the elongate semiconductive pillars 238 (including the lateral shapes and the lateral dimensions of the storage node contact regions 238b and the digit line contact regions 238a thereof) may correspond to the lateral shapes and the lateral dimensions of the vertically lowermost portions of the elongate hard mask structures 230 (FIG. 8D) employed to form the elongate semiconductive pillars 238. For example, as shown in FIG. 8E, by controlling ARDE of the hard mask material 204 (FIG. 8C) through selection of the first angle θ of the parallel linear trenches 210 (FIG. 8D) and the second angle α of the additional parallel linear trenches 222 (FIG. 8D) of the patterned masking structure 218 (FIG. 8D), the elongate semiconductive pillars 238 may be formed such that portions of the storage node contact regions 238b and the digit line contact regions 238a thereof outwardly laterally extend beyond the lateral boundaries of the elongate pillar structures 220 (FIG. 8D)(prior to the removal of the elongate pillar structures 220) of the patterned masking structure 218 (FIG. 8D) employed to form the elongate semiconductive pillars 238. At least portions of the elongate semiconductive pillars 238 outwardly laterally extending beyond the boundaries of the second opposing side surfaces 219 (FIG. 8D) (prior to the removal of the patterned masking structure 218) may permit the storage node contact regions 238b of the elongate semiconductive pillars 238 to exhibit greater lateral cross-sectional areas relative to those of conventional storage node contact regions of many conventional semiconductive pillars. Accordingly, the lateral geometric configurations (e.g., lateral shapes, lateral dimensions) of the elongate semiconductive pillars 238 may increase storage node (e.g., memory cell) alignment margins, may improve storage node contact area, may permit increased storage node lateral dimensions, and/or may reduce risks of shorts and junction leakage as compared to conventional semiconductive pillar lateral geometric configurations.

Following the formation of the elongate semiconductive pillars 238, the semiconductor device structure 200 may be subjected to additional processing, as desired. The semiconductor device structure 200 may, for example, be subjected to the additional processing acts previously described with respect to the semiconductor device structure 100 following the formation of the elongate semiconductive pillars 138 (e.g., the additional processing acts described with reference to FIGS. 6A through 7B).

Figure 9A:
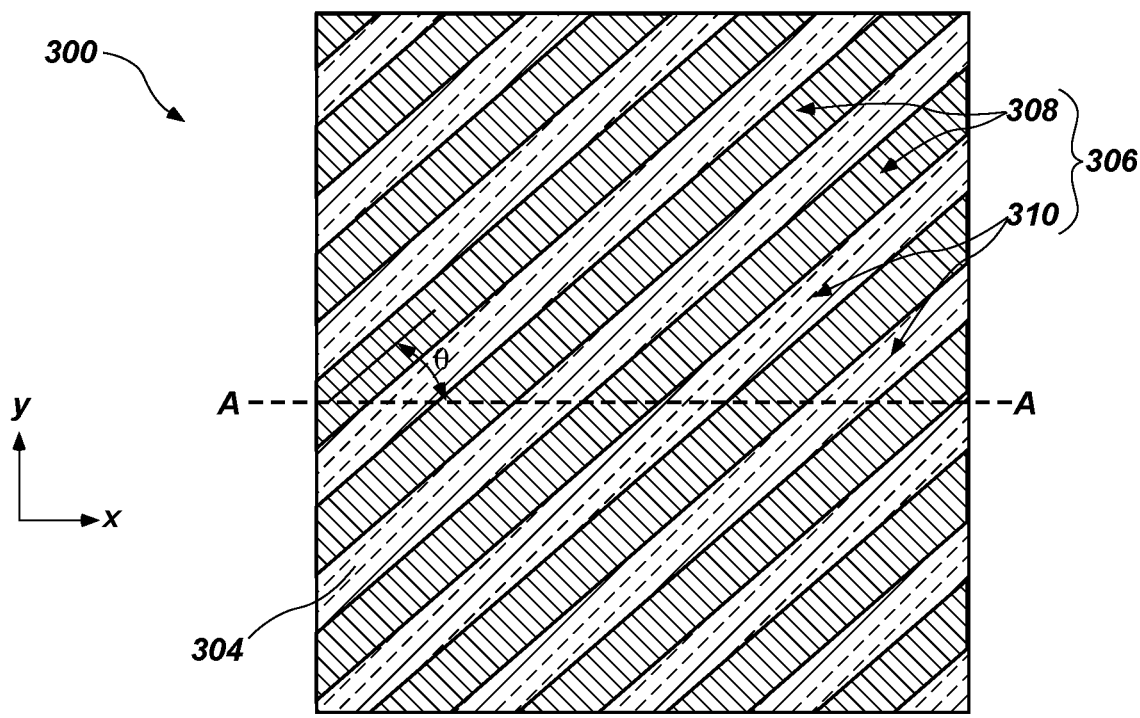
FIGS. 9A through 9E are simplified partial top-down views illustrating a method of forming another semiconductor device structure, in accordance with additional embodiments of the disclosure.

In accordance with additional embodiments of the disclosure, FIGS. 9A through 9E are simplified partial top-down views illustrating a method of forming a semiconductor device structure 300. Referring to FIG. 9A, a semiconductor device structure 300 may include a patterned masking material 306 on or over a hard mask material 304. The hard mask material 304 may be positioned on or over a semiconductor material substantially similar to the semiconductive material 102 previously described with reference to FIG. 1B. As shown in FIG. 9A, the patterned masking material 306 may include parallel line structures 308 separated from one another by parallel linear trenches 310. The parallel line structures 308 and the parallel linear trenches 310 may be substantially similar to the parallel line structures 108 and the parallel linear trenches 110 of the patterned masking material 106 previously described with reference to FIGS. 1A and 1B, except that the parallel line structures 308 and the parallel linear trenches 310 may be oriented at a different first angle θ relative to the first lateral direction (e.g., the X-direction) than the parallel line structures 108 (FIGS. 1A and 1B) and the parallel linear trenches 110 (FIGS. 1A and 1B). For example, the first angle θ of the parallel line structures 308 and the parallel linear trenches 310 may be less than sixty-nine (69) degrees, such as between sixty-nine (69) degrees and zero (0) degrees. In some embodiments, the first angle θ of the parallel line structures 308 and the parallel linear trenches 310 is about forty-nine (49) degrees. The different orientations (e.g., the different first angle θ) of the parallel line structures 308 and the parallel linear trenches 310 relative to the parallel line structures 108 (FIGS. 1A and 1B) and the parallel linear trenches 110 (FIGS. 1A and 1B) at least partially affects the lateral dimensions and the lateral shapes of features formed from the hard mask material 304 through the ARDE, as well as the lateral dimensions and the lateral shapes of features to be subsequently formed from the semiconductor material underlying the hard mask material 304 using such features formed from the hard mask material 304, as described in further detail below.

Figure 9B:
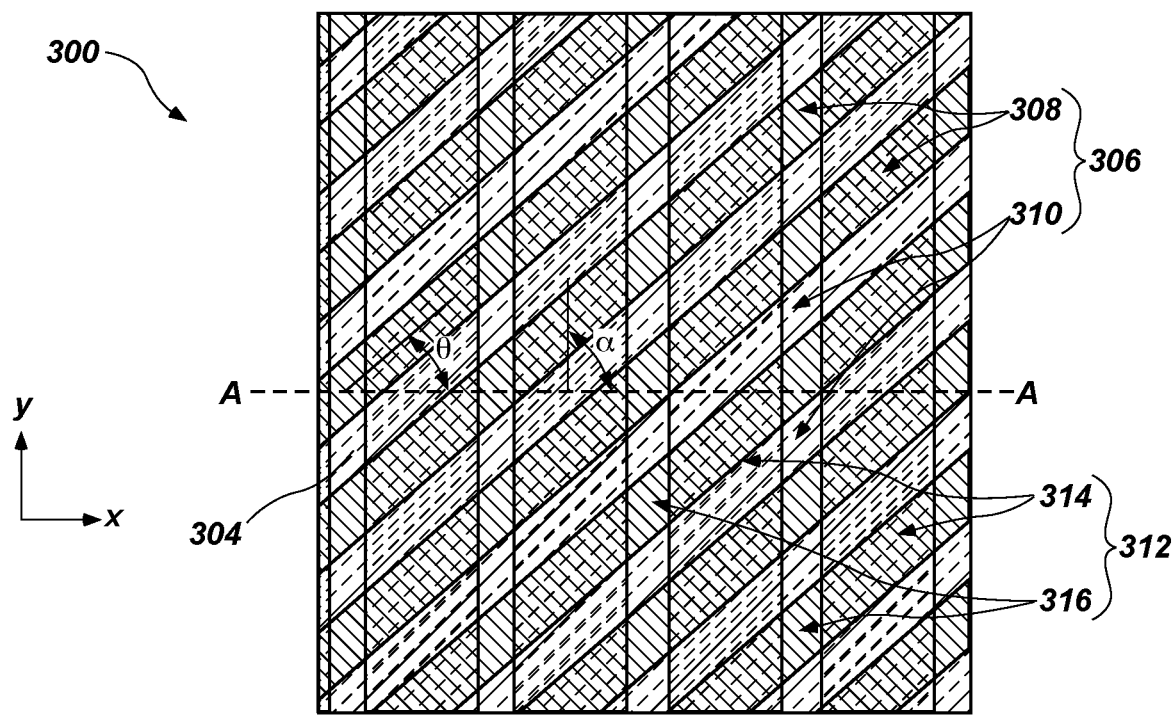

Referring to next to FIG. 9B, a mask 312 (e.g., an etch mask, a chop mask) including additional parallel line structures 314 and parallel linear apertures 316 may be provided on or over the patterned masking material 306. The additional parallel line structures 314 and the parallel linear apertures 316 may respectively be substantially similar to those of additional parallel line structures 214 and parallel linear apertures 216 of the mask 212 previously described with reference to FIG. 8B. In some embodiments, the additional parallel line structures 314 and the parallel linear apertures 316 are each formed at a second angle α offset from the first lateral direction (e.g., the X-direction) by about ninety (90) degrees. The orientations (e.g., the second angle α) of the additional parallel line structures 314 and the parallel linear apertures 316 relative to the different orientations (e.g., the different first angle θ) of the parallel line structures 308 and the parallel linear trenches 310 of the patterned masking material 306 affects the lateral dimensions and the lateral shapes of features formed from the hard mask material 304 through the ARDE, as well as the lateral dimensions and the lateral shapes of features to be subsequently formed from the semiconductor material underlying the hard mask material 304 using such features formed from the hard mask material 304, as described in further detail below.

Figure 9C:
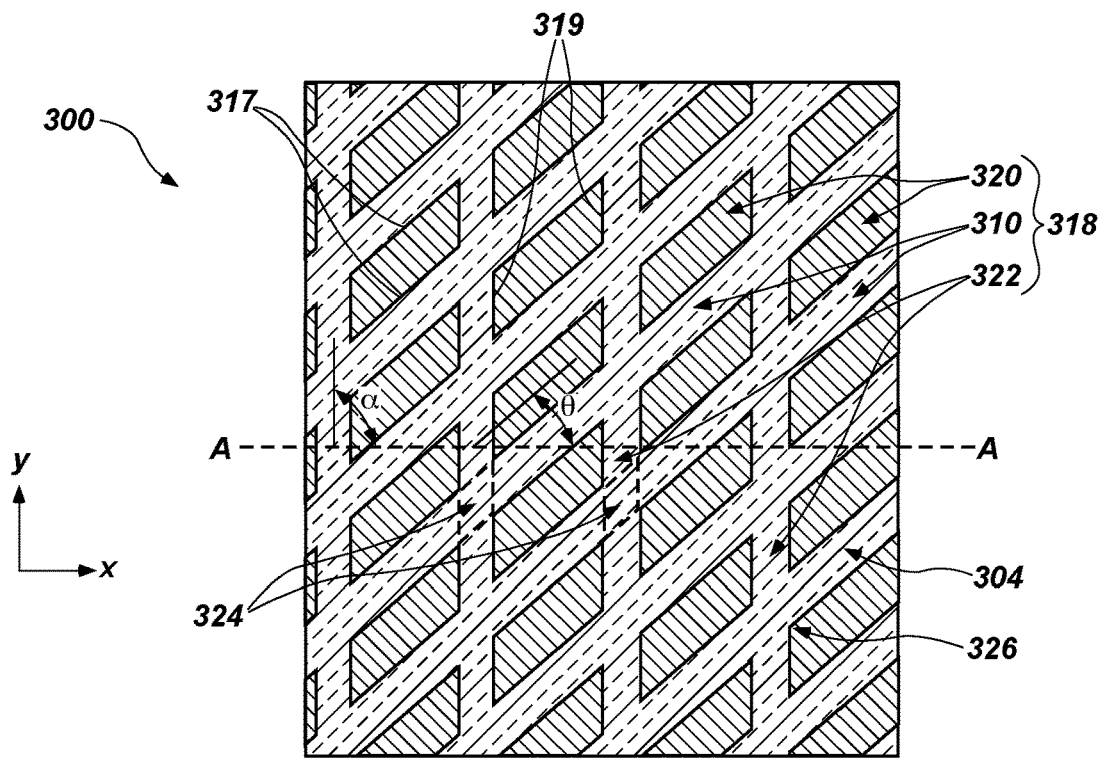

Next, referring to FIG. 9C, portions of the parallel line structures 308 (FIG. 9A) of the patterned masking material 306 (FIG. 9A) remaining uncovered by the additional parallel line structures 314 (FIG. 9B) of the mask 312 (FIG. 9B) may be subjected to at least one material removal process to form a patterned masking structure 318 including elongate pillar structures 320, the parallel linear trenches 310, and additional parallel linear trenches 322. The elongate pillar structures 320 may each exhibit a parallelogram lateral cross-sectional shape. In addition, the elongate pillar structures 320 may each individually include first opposing side surfaces 317 extending parallel to one another at the first angle θ, second opposing side surfaces 319 extending parallel to one another at the second angle α, and tips 326 (e.g., corners, such as angled corners) intervening between the first opposing side surfaces 317 and the second opposing side surfaces 319. As shown in FIG. 9C, the smaller first angle θ of the parallel line structures 308 (FIG. 9A) and the parallel linear trenches 310 (FIG. 9A) relative to that of the parallel line structures 108 (FIGS. 1A and 1B) and the parallel linear trenches 110 (FIGS. 1A and 1B), in combination with the larger second angle α of the parallel linear apertures 316 (FIG. 9B) of the mask 312 (FIG. 9B) relative to that of the parallel linear apertures 116 (FIGS. 2A and 2B) of the mask 112 (FIGS. 2A and 2B), modifies the configurations of intersections between the parallel linear trenches 310 and the additional parallel linear trenches 322 such that overlapping trench regions 324 of the patterned masking structure 318 exhibit different lateral shapes, lateral dimensions, and lateral positioning relative to the overlapping trench regions 124, 224 (FIGS. 3A and 8C) of the patterned masking structures 118, 218 (FIGS. 3A and 8C). For example, the overlapping trench regions 324 laterally intervening between tips 326 of laterally-neighboring elongate pillar structures 320 may exhibit different lateral shapes than the overlapping trench regions 124, 224 (FIGS. 3A and 8C), and may laterally terminate closer to the second opposing side surfaces 319 of the elongate pillar structures 320. The relatively different configurations of the overlapping trench regions 324 may, in turn, modify the lateral shapes and lateral dimensions of features subsequently formed from the hard mask material 304, as described in further detail below. For example, the modified configurations of the overlapping trench regions 324 (relative to the overlapping trench regions 224 of the patterned masking structure 218) may modify the locations and/or the magnitudes of regions of the subsequently-formed features exhibiting variable lateral dimensions throughout the heights (e.g., vertical dimensions) thereof.

Figure 9D:
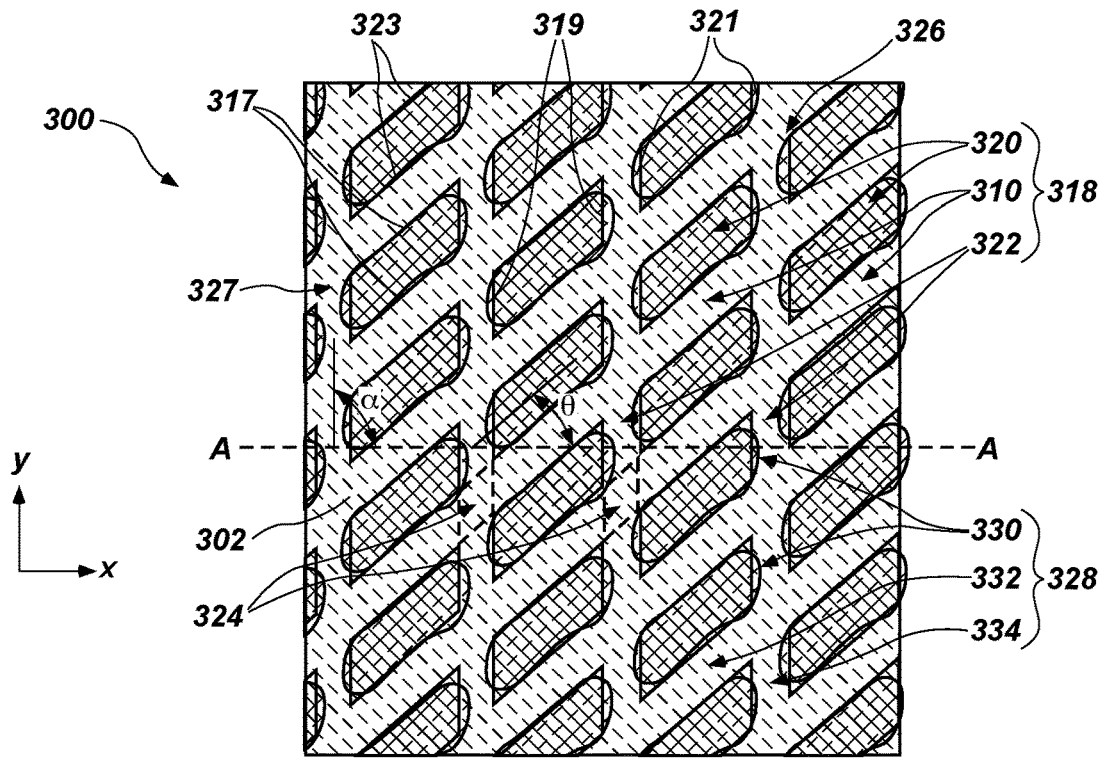

Referring next to FIG. 9D, portions of the hard mask material 304 (FIG. 9C) remaining uncovered by the elongate pillar structures 320 (FIG. 9C) of the patterned masking structure 318 may be removed through ARDE to form a patterned hard mask material 328 including elongate hard mask structures 330, first trenches 332, and second trenches 334. The elongate hard mask structures 330 may each individually include first opposing side surfaces 321, second opposing side surfaces 323, and tips 327 (e.g., corners, such as radiused corners) intervening between the first opposing side surfaces 321 and the second opposing side surfaces 323. As shown in FIG. 9D, as a result of the modified configurations of the overlapping trench regions 324 of the patterned masking structure 318 (relative to the overlapping trench regions 124, 224 of the patterned masking structures 118, 218 previously described with reference to FIGS. 4A and 8D), the lateral positions, lateral shapes, and lateral sizes of portions (e.g., vertically lower portions) of the elongate pillar structures 320 outwardly laterally extending beyond the lateral boundaries of the elongate pillar structures 320 of the patterned masking structure 318 may be different than the lateral positions, lateral shapes, and lateral sizes of portions (e.g., vertically lower portions) of the elongate pillar structures 120, 220 (FIGS. 4A and 8D) outwardly laterally extending beyond the lateral boundaries of the elongate pillar structures 120, 220 (FIGS. 4A and 8D) of the patterned masking structures 118, 218 (FIGS. 4A and 8D). For example, as a result of the different termination points of the overlapping trench regions 324, regions (e.g., vertically lower regions) of one or more portions of first opposing side surfaces 321, the second opposing side surfaces 323, and the tips 327 of the elongate hard mask structures 330 located at and/or proximate the tips 327 of the elongate hard mask structures 330 may laterally extend (e.g., laterally protrude) into the area underlying the overlapping trench regions 324 of the patterned masking structure 318.

Figure 9E:
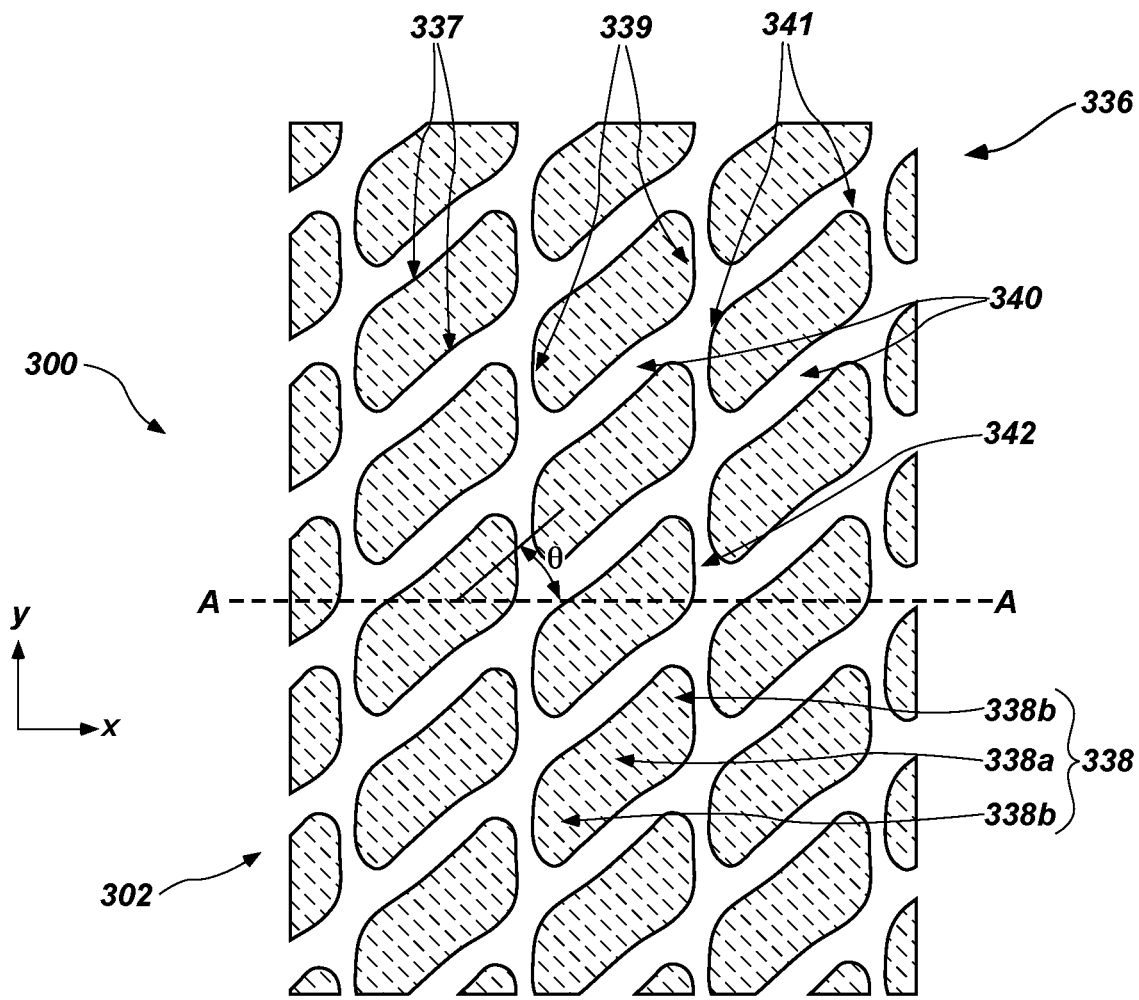

Next, referring to FIG. 9E, portions of a semiconductive material 302 (FIG. 9C) remaining uncovered by the elongate hard mask structures 330 (FIG. 9D) of the patterned hard mask material 328 (FIG. 9D) may be selectively removed to form a patterned semiconductive material 336 including elongate semiconductive pillars 338, first trenches 340, and second trenches 342. The elongate semiconductive pillars 338 may each individually include first opposing side surfaces 337, second opposing side surfaces 339, and tips 341 (e.g., corners, such as radiused corners) intervening between the first opposing side surfaces 337 and the second opposing side surfaces 339. In addition, the elongate semiconductive pillars 338 may each include storage node contact regions 338$b$ proximate second opposing side surfaces 339 thereof, and a digit line contact region 338$a$ located laterally between the storage node contact regions 338$b$ and proximate a center of the elongate semiconductive pillar 338. The lateral shapes and lateral dimensions of the elongate semiconductive pillars 338 (including the lateral shapes and the lateral dimensions of the storage node contact regions 338$b$ and the digit line contact regions 338$a$ thereof) may correspond to the lateral shapes and the lateral dimensions of the vertically lowermost portions of the elongate hard mask structures 330 (FIG. 9D) employed to form the elongate semiconductive pillars 338. For example, as shown in FIG. 9E, by controlling ARDE of the hard mask material 304 (FIG. 9C) through selection of the first angle θ of the parallel linear trenches 310 (FIG. 9D) and the second angle α of the additional parallel linear trenches 322 (FIG. 9D) of the patterned masking structure 318 (FIG. 9D), the elongate semiconductive pillars 338 may be formed such that portions of the storage node contact regions 338$b$ outwardly laterally extend beyond the lateral boundaries of the elongate pillar structures 320 (FIG. 9D) (prior to the removal of the elongate pillar structures 320) of the patterned masking structure 318 (FIG. 9D) employed to form the elongate semiconductive pillars 338 while the digit line contact regions 338$a$ are substantially confined within the lateral boundaries of the elongate pillar structures 320 (FIG. 9D). At least portions of the elongate semiconductive pillars 338 outwardly laterally extending beyond the boundaries of the first opposing side surfaces 317 (FIG. 9D), the second opposing side surfaces 319 (FIG. 9D), and the tips 326 (FIG. 9D) of the elongate pillar structures 320 (FIG. 9D) (prior to the removal of the patterned masking structure 318) at or proximate the tips 326 (FIG. 9D) may permit the storage node contact regions 338$b$ of the elongate semiconductive pillars 338 to exhibit greater lateral cross-sectional areas relative to those of conventional storage node contact regions of many conventional semiconductive pillars. Accordingly, the lateral geometric configurations (e.g., lateral shapes, lateral dimensions) of the elongate semiconductive pillars 338 may increase storage node (e.g., memory cell) alignment margins, may improve storage node contact area, may permit increased storage node lateral dimensions, and/or may reduce risks of shorts and junction leakage as compared to conventional semiconductive pillar lateral geometric configurations.

Following the formation of the elongate semiconductive pillars 338, the semiconductor device structure 300 may be subjected to additional processing, as desired. The semiconductor device structure 300 may, for example, be subjected to the additional processing acts previously described with respect to the semiconductor device structure 100 following the formation of the elongate semiconductive pillars 138 (e.g., the additional processing acts described with reference to FIGS. 6A through 7B).

Figure 10:
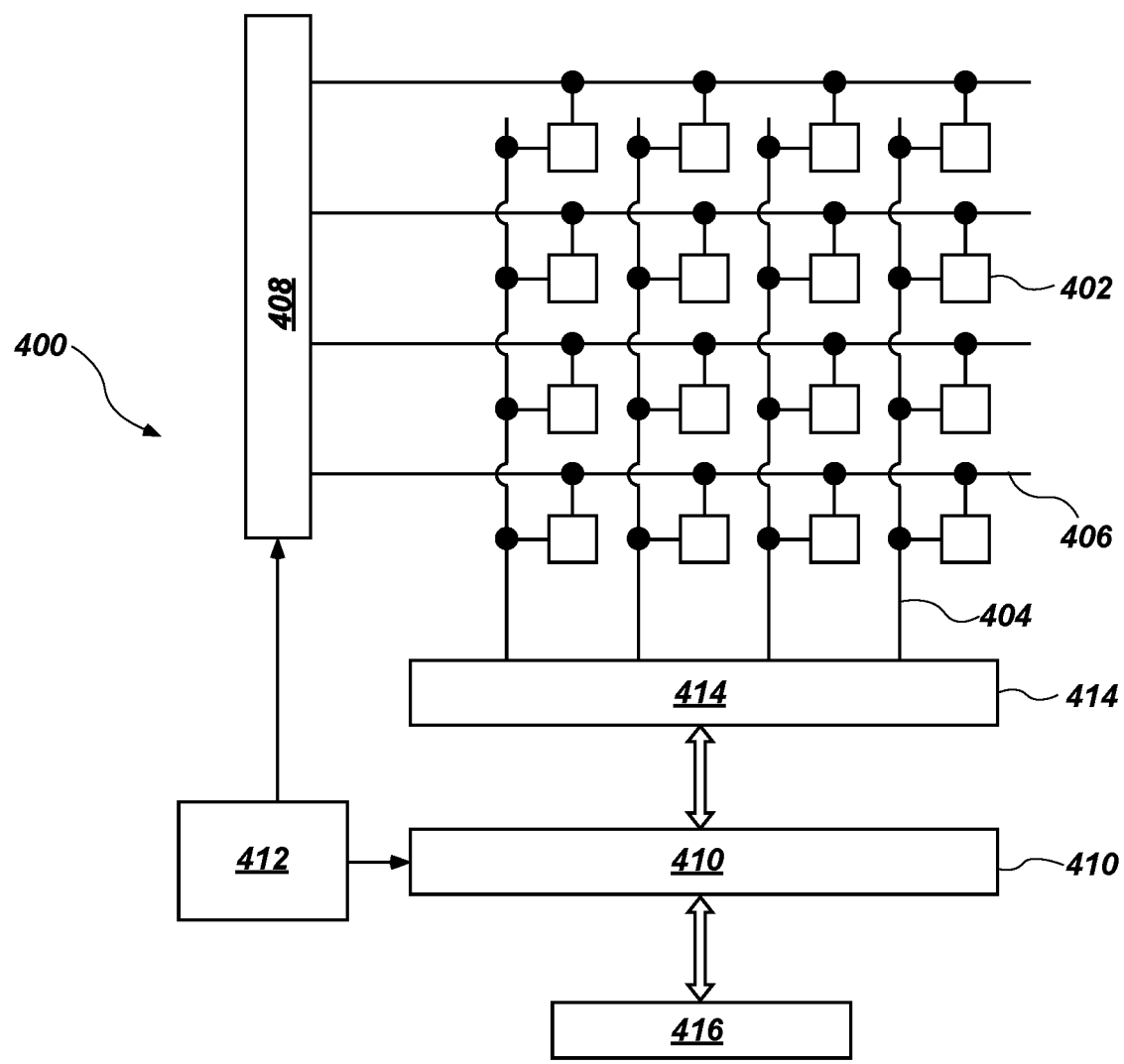
FIG. 10 is a functional block diagram of a memory device, in accordance with an embodiment of the disclosure.

FIG. 10 illustrates a functional block diagram of a memory device 400, in accordance with an embodiment of the disclosure. The memory device 400 may include, for example, an embodiment of the semiconductor device structure 100 previously described herein. As shown in FIG. 10, the memory device 400 may include memory cells 402, digit lines 404 (e.g., corresponding to the digit lines 148 of the semiconductor device structure 100 shown in FIGS. 6A through 7B), word lines 406 (e.g., corresponding to the word lines 143 of the semiconductor device structure 100 shown in FIGS. 6A and 7A), a row decoder 408, a column decoder 410, a memory controller 412, a sense device 414, and an input/output device 416.

The memory cells 402 of the memory device 400 are programmable to at least two different logic states (e.g., logic 0 and logic 1). Each memory cell 402 may individually include a capacitor and transistor (e.g., a pass transistor). The capacitor stores a charge representative of the programmable logic state (e.g., a charged capacitor may represent a first logic state, such as a logic 1; and an uncharged capacitor may represent a second logic state, such as a logic 0) of the memory cell 402. The transistor grants access to the capacitor upon application (e.g., by way of one of the word lines 406) of a minimum threshold voltage to a semiconductive channel thereof for operations (e.g., reading, writing, rewriting) on the capacitor.

The digit lines 404 are connected to the capacitors (e.g., corresponding to the storage node structures 154 of the semiconductor device structure 100 shown in FIGS. 7A and 7B) of the memory cells 402 by way of the transistors of the memory cells 402. The word lines 406 extend perpendicular to the digit lines 404, and are connected to gates of the transistors of the memory cells 402. Operations may be performed on the memory cells 402 by activating appropriate digit lines 404 and word lines 406. Activating a digit line 404 or a word line 406 may include applying a voltage potential to the digit line 404 or the word line 406. Each column of memory cells 402 may individually be connected to one of the digit lines 404, and each row of the memory cells 402 may individually be connected to one of the word lines 406. Individual memory cells 402 may be addressed and accessed through the intersections (e.g., cross points) of the digit lines 404 and the word lines 406.

The memory controller 412 may control the operations of memory cells 402 through various components, including the row decoder 408, the column decoder 410, and the sense device 414. The memory controller 412 may generate row address signals that are directed to the row decoder 408 to activate (e.g., apply a voltage potential to) predetermined word lines 406, and may generate column address signals that are directed to the column decoder 410 to activate (e.g., apply a voltage potential to) predetermined digit lines 404. The memory controller 412 may also generate and control various voltage potentials employed during the operation of the memory device 400. In general, the amplitude, shape, and/or duration of an applied voltage may be adjusted (e.g., varied), and may be different for various operations of the memory device 400.

During use and operation of the memory device 400, after being accessed, a memory cell 402 may be read (e.g., sensed) by the sense device 414. The sense device 414 may compare a signal (e.g., a voltage) of an appropriate digit line 404 to a reference signal in order to determine the logic state of the memory cell 402. If, for example, the digit line 404 has a higher voltage than the reference voltage, the sense device 414 may determine that the stored logic state of the memory cell 402 is a logic 1, and vice versa. The sense device 414 may include transistors and amplifiers to detect and amplify a difference in the signals (commonly referred to in the art as "latching"). The detected logic state of a memory cell 402 may be output through the column decoder 410 to the input/output device 416. In addition, a memory cell 402 may be set (e.g., written) by similarly activating an appropriate word line 406 and an appropriate digit line 404 of the memory device 400. By controlling the digit line 404 while the word line 406 is activated, the memory cell 402 may be set (e.g., a logic value may be stored in the memory cell 402). The column decoder 410 may accept data from the input/output device 416 to be written to the memory cells 402. Furthermore, a memory cell 402 may also be refreshed (e.g., recharged) by reading the memory cell 402. The read operation will place the contents of the memory cell 402 on the appropriate digit line 404, which is then pulled up to full level (e.g., full charge or discharge) by the sense device 414. When the word line 406 associated with the memory cell 402 is deactivated, all of memory cells 402 in the row associated with the word line 406 are restored to full charge or discharge.

Thus, a memory device according to embodiments of the disclosure comprises a memory controller, a row decoder, a column decoder, word lines, digit lines, memory cells, and elongate semiconductive pillars. The row decoder is operably coupled to the memory controller. The column decoder operably coupled to the memory controller. The word lines are operably coupled to the row decoder. The digit lines are operably coupled to the column decoder. The memory cells are positioned proximate intersections of the word lines and the digit lines, and comprise storage node structures and access devices electrically connected to the storage node structures. The elongate semiconductive pillars operably coupled to the storage node structures memory cells and the digit lines. The elongate semiconductive pillars each comprise storage node contact regions, and a digit line contact region laterally between the memory cell contact regions and exhibiting a narrower width than the memory cell contact regions.

Figure 11:
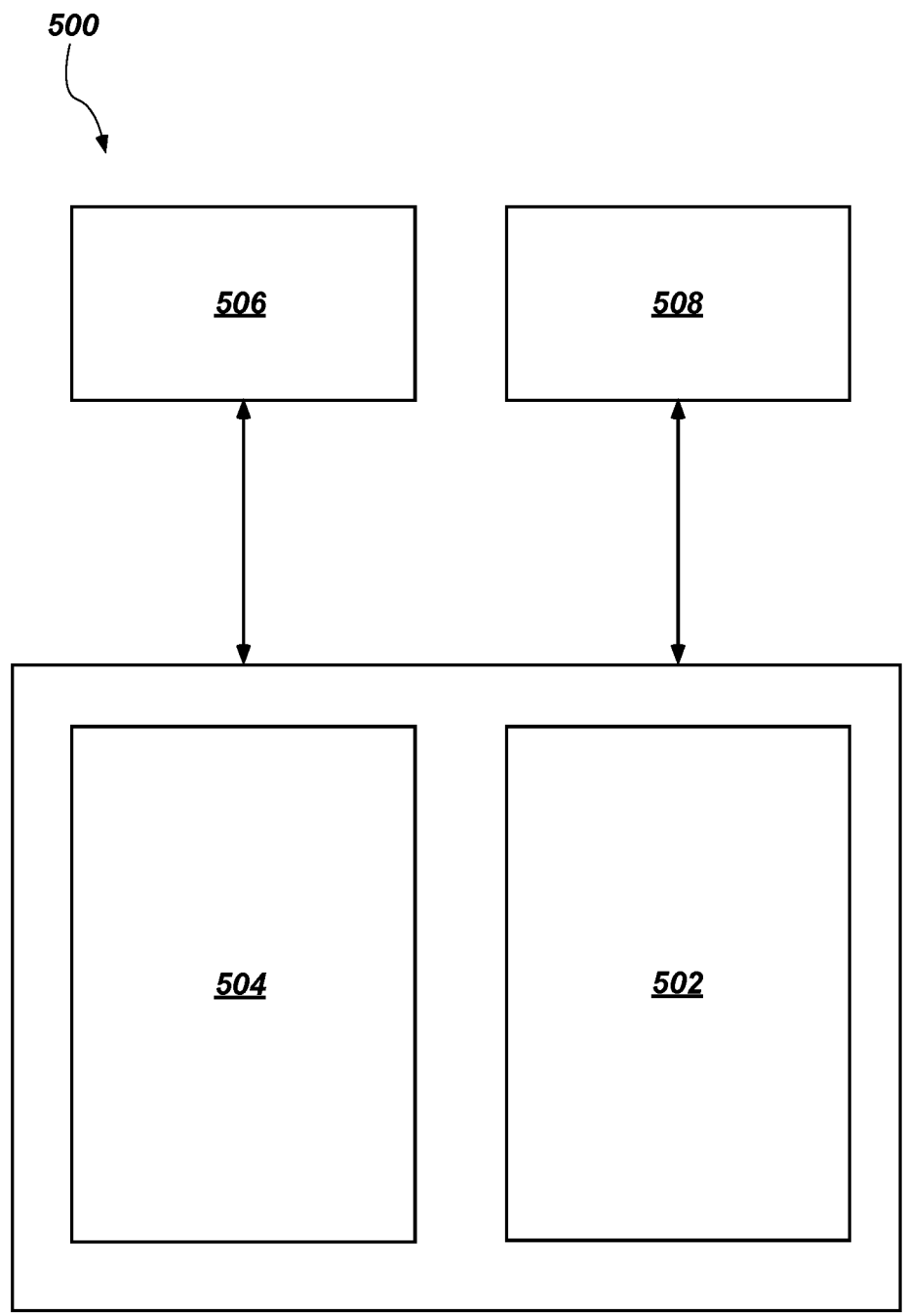
FIG. 11 is a schematic block diagram of an electronic system, in accordance with an embodiment of the disclosure.

Semiconductor device structures (e.g., the semiconductor device structures 100, 200, 300) and semiconductor devices (e.g., the memory device 400) in accordance with embodiments of the disclosure may be used in embodiments of electronic systems of the disclosure. For example, FIG. 11 is a block diagram of an illustrative electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 500 includes at least one memory device 502. The memory device 502 may comprise, for example, an embodiment of one or more of a semiconductor device structure (e.g., semiconductor device structures 100, 200, 300) and a semiconductor device (e.g., the memory device 400) previously described herein. The electronic system 500 may further include at least one electronic signal processor device 504 (often referred to as a "microprocessor"). The electronic signal processor device 504 may, optionally, include an embodiment of a semiconductor device structure (e.g., semiconductor device structures 100, 200, 300) and a semiconductor device (e.g., the memory device 400) previously described herein. The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, a monitor, a display, a printer, an audio output jack, a speaker, etc. In some embodiments, the input device 506 and the output device 508 may comprise a single touchscreen device that can be used both to input information to the electronic system 500 and to output visual information to a user. The input device 506 and the output device 508 may communicate electrically with one or more of the memory device 502 and the electronic signal processor device 504.

Thus, an electronic system according to embodiments of the disclosure comprises an input device, an output device, a processor device operably coupled to the input device and the output device, and a memory device operably coupled to the processor device. The memory device comprises at least one elongate semiconductive pillar comprising a digit line contact region, and storage node contact regions laterally flanking the digit line contact region. Each of the storage node contact regions individually exhibits a larger lateral cross-sectional area than the digit line contact region.

The methods of the disclosure provide an effective and reliable way to manipulate the dimensions, shapes, and spacing of features (e.g., the elongate semiconductive pillars 138, 238, 338) of semiconductor device structures (e.g., the semiconductor device structures 100, 200, 300) of a semiconductor device (e.g., a memory device, such as a DRAM device) using ARDE effects. The methods facilitate simple and cost-effective formation and alignment of the digit line contacts and storage node contacts with reduced risk of shorts and junction leakage as compared to conventional methods of forming and aligning digit line contacts and storage node contacts for a semiconductor device structure. The methods of the disclosure may facilitate improved device performance, lower cost, increased miniaturization of components, improved pattern quality, and greater packaging density as compared to conventional methods of forming and aligning contacts (e.g., digit line contacts, storage node contacts) for a semiconductor device structure.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A semiconductor device, comprising elongate semiconductive pillars each individually comprising a digit line contact region disposed laterally between two storage node contact regions, each of the two storage node contact regions having a larger width than the digit line contact region.

2. The semiconductor device of claim 1, further comprising:
   first trenches adjacent first opposing side surfaces of the elongate semiconductive pillars and oriented at a first angle within a range of from about 30 degrees to about 75 degrees offset from a first lateral direction; and
   second trenches adjacent second opposing side surfaces of the elongate semiconductive pillars and oriented at a second, different angle within a range of from about 0 degrees to about 90 degrees offset from the first lateral direction.

3. The semiconductor device of claim 2, wherein first opposing side surfaces and the second opposing side surfaces of each of the elongate semiconductive pillars are substantially vertical.

4. The semiconductor device of claim 3, wherein at least the first opposing side surfaces of each of the elongate semiconductive pillars are substantially non-planar.

5. The semiconductor device of claim 2, wherein the first angle is about 69 degrees and the second, different angle is about 41 degrees.

6. The semiconductor device of claim 2, wherein the first angle is about 69 degrees and the second, different angle is about 90 degrees.

7. The semiconductor device of claim 2, wherein the first angle is about 49 degrees and the second, different angle is about 90 degrees.

8. The semiconductor device of claim 1, further comprising:
   a digit line contact at the digit line contact region of each of the elongate semiconductive pillars;
   storage node contacts at the two storage node contact regions of each of the elongate semiconductive pillars;
   digit lines individually in electrical communication with the digit line contact of each of the elongate semiconductive pillars;
   word lines laterally extending in a different direction than the digit lines; and
   storage node structures individually in electrical communication with the storage node contacts, and positioned proximate intersections of the digit lines and the word lines.

9. The semiconductor device of claim 8, further comprising redistribution structures in electrical communication with and extending between the storage node contacts and the storage node structures, upper portions of the redistribution structures underlying the storage node structures and laterally offset from lower portions of the redistribution structures overlying the storage node contacts.

* * * * *